(12) United States Patent
Kanamori et al.

(10) Patent No.: US 7,737,773 B2
(45) Date of Patent: Jun. 15, 2010

(54) SEMICONDUCTOR DEVICE, STEP-DOWN CHOPPER REGULATOR, AND ELECTRONIC EQUIPMENT

(75) Inventors: Atsushi Kanamori, Nara (JP); Hirohisa Warita, Nara (JP); Tadamasa Kimura, Tenri (JP)

(73) Assignee: Sharp Kabushiki Kaisha, Osaka-Shi (JP)

( * ) Notice: Subject to any disclaimer, the term of this patent is extended or adjusted under 35 U.S.C. 154(b) by 325 days.

(21) Appl. No.: 11/847,887

(22) Filed: Aug. 30, 2007

(65) Prior Publication Data

US 2008/0084243 A1    Apr. 10, 2008

(30) Foreign Application Priority Data

Aug. 31, 2006  (JP) ............................. 2006-235558
Aug. 31, 2006  (JP) ............................. 2006-235576

(51) Int. Cl.
*H02M 7/537* (2006.01)
(52) U.S. Cl. .................... 327/589; 327/537; 326/88
(58) Field of Classification Search ......... 323/282–285, 323/224, 271, 290; 363/97, 98
See application file for complete search history.

(56) References Cited

U.S. PATENT DOCUMENTS

| 5,883,547 | A | 3/1999 | Diazzi et al. |
| 7,019,501 | B2 | 3/2006 | Dogome et al. |
| 7,084,697 | B2 | 8/2006 | Kawagoshi |
| 7,106,105 | B2 * | 9/2006 | Bryson .................... 326/88 |
| 2007/0159150 | A1 | 7/2007 | Hosokawa et al. |

FOREIGN PATENT DOCUMENTS

| JP | 5-304768 A | 11/1993 |
| JP | 2000-92822 A | 3/2000 |
| JP | 2003-244946 A | 8/2003 |

* cited by examiner

*Primary Examiner*—Rajnikant B Patel
(74) *Attorney, Agent, or Firm*—Birch, Stewart, Kolasch & Birch, LLP

(57) ABSTRACT

A bootstrap circuit for a step-down chopper regulator IC includes an LDMOS transistor having a gate and a source connected to output terminals of a constant voltage circuit and a drain connected to a leader terminal of a boot voltage, and a bootstrap control circuit that performs control of turning on and off the LDMOS transistor so as to support high-speed oscillation without requiring expensive process and realize a stable step-down chopping action with a wide input voltage range.

20 Claims, 21 Drawing Sheets

SEMICONDUCTOR DEVICE, STEP-DOWN CHOPPER REGULATOR, AND ELECTRONIC EQUIPMENT

CROSS-REFERENCE TO RELATED APPLICATIONS

This application is based on Japanese Patent Applications No. 2006-235558 and No. 2006-235576 filed on Aug. 31, 2006, the contents of which are hereby incorporated by reference.

BACKGROUND OF THE INVENTION

1. Field of the Invention

The present invention relates to a power supply circuit that steps down an input voltage and supplies it to a load. In particular, the present invention relates to a step-down chopper regulator that obtains a drive voltage to be given to a gate of an output power transistor by a bootstrap method.

2. Description of Related Art

Improvement of power conversion efficiency causes effects of energy saving, long life of batteries, reduction of heat and the like, so it is the most important task for a switching power supply. In addition, as a result of recent promotion of energy saving, equipment to be supplied with power from the switching power supply has become to support low voltage, i.e., capable of working at low voltage like 2.5 volts or 1.5 volts in general. On the other hand, current required by the equipment is tending to increase. In the switching power supply, a power loss due to on-resistance of a switching element that increases in proportion to increase of current flowing in the equipment is a main factor that lowers the power conversion efficiency. Therefore, it is important task how to reduce the on-resistance of the switching element.

Note that the on-resistance of the switching element can be reduced by increasing a size of the switching element, but the increase of size of the switching element must be minimized because it causes increase of cost. In addition, comparing an N-channel MOS transistor (or an NPN bipolar transistor) with a P-channel MOS transistor (or a PNP bipolar transistor) as the switching element, the N-channel MOS transistor (or an NPN bipolar transistor) is more preferable because its chip size can be reduced for integration. However, since a bootstrap type gate voltage generating circuit (hereinafter referred to as a bootstrap circuit) is necessary for driving the N-channel MOS transistor, it is necessary to constitute the bootstrap circuit at low cost.

FIG. 21 is a circuit diagram showing an example of a conventional step-down chopper regulator that uses a bootstrap circuit.

The bootstrap circuit shown in FIG. 21 has a structure in which a boot diode 106 and a boot capacitor 107 are connected in parallel with an output power transistor 100 (the switching element) of the step-down chopper regulator. When the output power transistor 100 is turned off, an input voltage Vin charges the boot capacitor 107 through the boot diode 106. Therefore, a boot voltage Vboot that is applied to a drive circuit 102 is higher than an output voltage Vout (that is source voltage of the output power transistor 100) by charged voltage of the boot capacitor 107 (Vin−Vf) (Vf is forward drop voltage of the boot diode 106, which is approximately 0.4 volts).

Furthermore, in a case of a single chip IC that includes the output power transistor 100, the output power transistor 100 is usually made up of a laterally diffused MOS transistor (hereinafter referred to as LDMOS) that has high drain withstand voltage and is capable of reducing the on-resistance per unit area.

An example of a conventional technique related to the above description is disclosed in JP-A-H5-304768, JP-A-2000-92822 and the like.

JP-A-H5-304768 discloses and proposes a DC-DC converter having a structure in which a MOS-FET is used as the switching element, a high input voltage Vi is converted into a low output voltage Vo, the output voltage Vo is compared with the reference voltage by a pulse width control IC so that open and close of the switching element is controlled via a gate driving circuit. This DC-DC converter includes a constant voltage circuit disposed that stabilizes gate drive voltage for the switching element between the gate driving circuit and an input power source terminal.

In addition, JP-A-2000-92822 discloses and proposes a drive power supply circuit for a semiconductor switching element having a structure in which a plurality of semiconductor switching elements are connected in series between the positive and the negative electrodes of a first DC power source, a first capacitor is connected in parallel with a second DC power source, the anode of a first diode is connected to the positive electrode of the second DC power source, a series circuit of a second diode, a second capacitor and a first transistor, and a series circuit of a zener diode, a resistor and a second transistor are connected in parallel between the cathode of the first diode and the negative electrode of the second DC power source, a third capacitor is connected in parallel with the zener diode, a third diode is connected between the node of the second diode and the second capacitor and the node of the zener diode and the resistor, a third transistor is connected between the node of the second capacitor and the first transistor and the node of the zener diode and the resistor, and the gate terminal of the third transistor is connected to the node of the resistor and the second transistor. The first and the second transistors are driven to be turned on and off alternately by an oscillator circuit, so that voltage of the third capacitor is used as the drive power for a semiconductor switching element on the positive side.

It is surely able to use the N-channel MOS transistor as the output power transistor 100 in the bootstrap type step-down chopper regulator shown in FIG. 21, so that a chip size of the integrated circuit can be reduced compared with the case where the P-channel MOS transistor is used.

However, in order to provide a bootstrap type step-down chopper regulator IC that includes the output power transistor 100 in a single chip for supporting low cost required recently, it is necessary to use the BiCDMOS (Bipolar Complementary Double-diffused MOS) process for making the boot diode 106 that requires the bipolar technique (including epitaxial steps), an LDMOS transistor used as the output power transistor 100 and CMOS (Complementary MOS) transistors that form other circuit portion (a main logic generating circuit 101 and the drive circuit 102 in FIG. 21) in a single wafer. Therefore, it is unnecessary to prepare the output power transistor 100 as a discrete component, but cost of the step-down chopper regulator IC increases. In addition, a much more expensive process is necessary for making the boot diode 106 as a Schottky barrier diode in order to support high speed oscillation.

In addition, as to the conventional bootstrap circuit shown in FIG. 21, the boot voltage Vboot varies in accordance with the input voltage Vin. Therefore, if the input voltage Vin is low, a level of the gate voltage for the output power transistor 100 decreases. On the contrary, if the input voltage Vin is high, the level of the gate voltage for the output power transistor 100 increases. For this reason, in the conventional bootstrap circuit described above, the input voltage Vin should be set by considering a gate withstand voltage of the output power transistor 100. It is unable to set exceeding the above-mentioned gate withstand voltage. In particular, if the output power transistor 100 is made up of the LDMOS transistor, the gate withstand voltage thereof is 10 volts or less in many cases so that the input voltage range becomes narrow.

Note that the conventional technique described in JP-A-H5-304768 proposes to provide the constant voltage circuit that stabilizes the gate drive voltage of the switching element between the gate driving circuit and the input power source terminal so as to supply a constant gate drive voltage regardless of the input voltage. However, the above-mentioned conventional constant voltage circuit generates the constant voltage based on the output voltage (the switched voltage having a rectangular waveform) as a reference voltage, so the constant voltage circuit has a very complicated structure.

In addition, the bootstrap type step-down chopper regulator is preferably required to deliver the output voltage Vout having a rectangular waveform, but it may be discontinuous mode in which the coil current Ic flowing in an output inductor 103 is not continuous if the coil current Ic is little. In this case, the boot capacitor 107 is charged insufficiently so that gate-source voltage of the output power transistor 100 rises insufficiently resulting in malfunction in the switching action.

SUMMARY OF THE INVENTION

An object of the present invention is to provide a semiconductor device for a step-down chopper regulator that has a wide input voltage range and is capable of supporting high-speed oscillation and a secure boot operation with a light load so as to realize a stable step-down chopping action without requiring an expensive process, and to provide a step-down chopper regulator and an electronic equipment that use the semiconductor device.

A semiconductor device according to the present invention is a one for a step-down chopper regulator, which includes a constant voltage circuit that generates a desired constant voltage from the input voltage with reference to a ground voltage, a bootstrap circuit that receives the constant voltage and generates a boot voltage that is higher than the output voltage, a first logic generating circuit that generates a first logic signal for performing control of turning on and off the first switching element, and a first drive circuit that performs control of turning on and off the first switching element by using the boot voltage based on the first logic signal. The bootstrap circuit includes an LDMOS transistor having a source connected to an output terminal of the constant voltage circuit and a drain connected to a leader terminal of the boot voltage, and a bootstrap control circuit that performs control of turning on and off the LDMOS transistor.

DETAILED DESCRIPTION OF THE PREFERRED EMBODIMENTS

First, a first embodiment of a step-down chopper regulator (a step-down switching regulator) according to the present invention will be described in detail.

Figure 1:
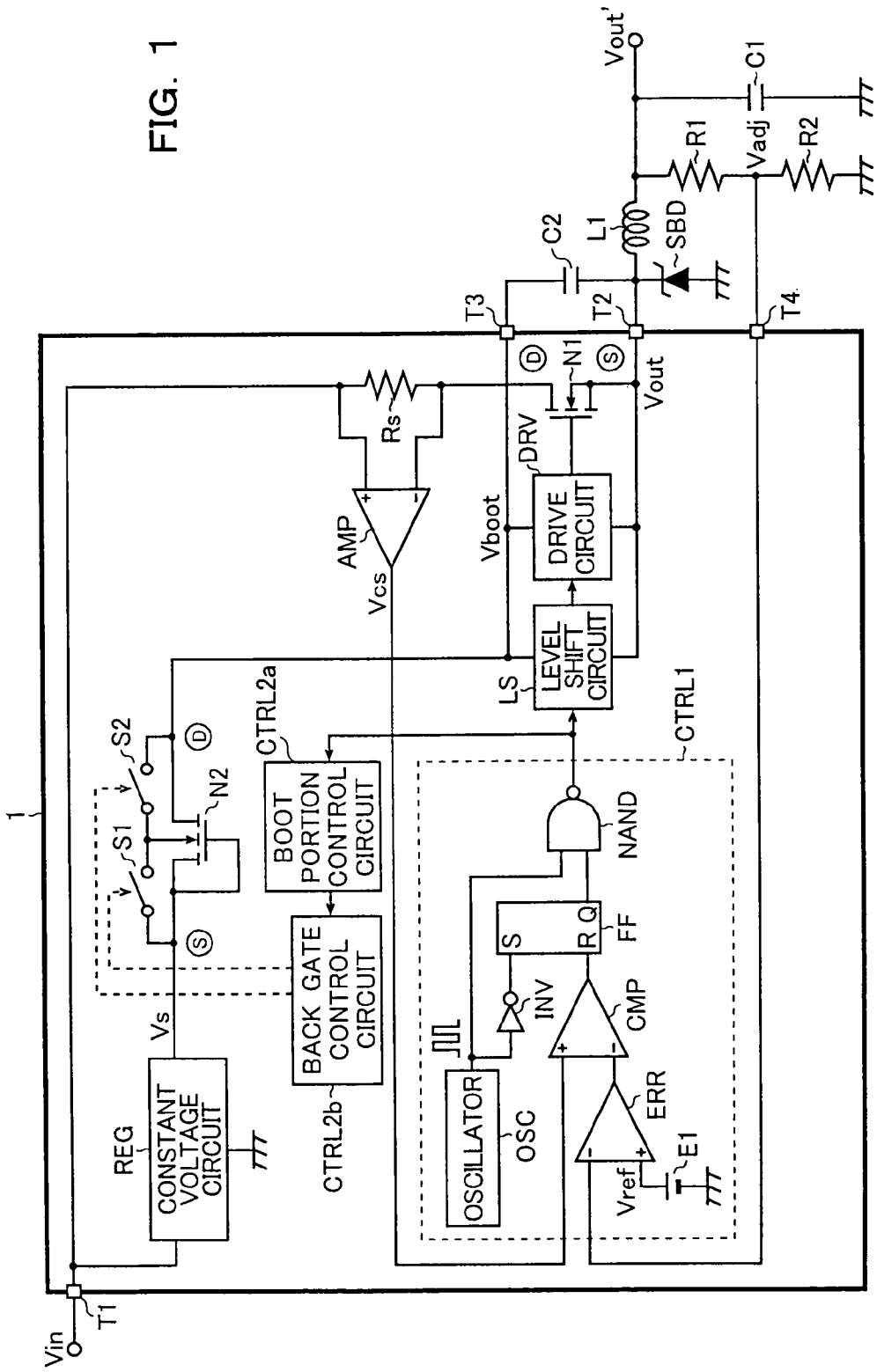
FIG. 1 is a block diagram showing a first embodiment of a step-down chopper regulator according to the present invention.

FIG. 1 is a block diagram showing the first embodiment of the step-down chopper regulator (step-down switching regulator) according to the present invention.

As shown in FIG. 1, the step-down chopper regulator according to the present invention is made up of a semiconductor device (a step-down chopper regulator IC) 1, an output inductor L1, an output capacitor C1, a Schottky barrier diode SBD, a boot capacitor C2, and resistors R1 and R2. It steps down an input voltage Vin so as to generate a desired smooth output voltage Vout', which is supplied to a load (not shown) as a drive voltage.

Figure 21:
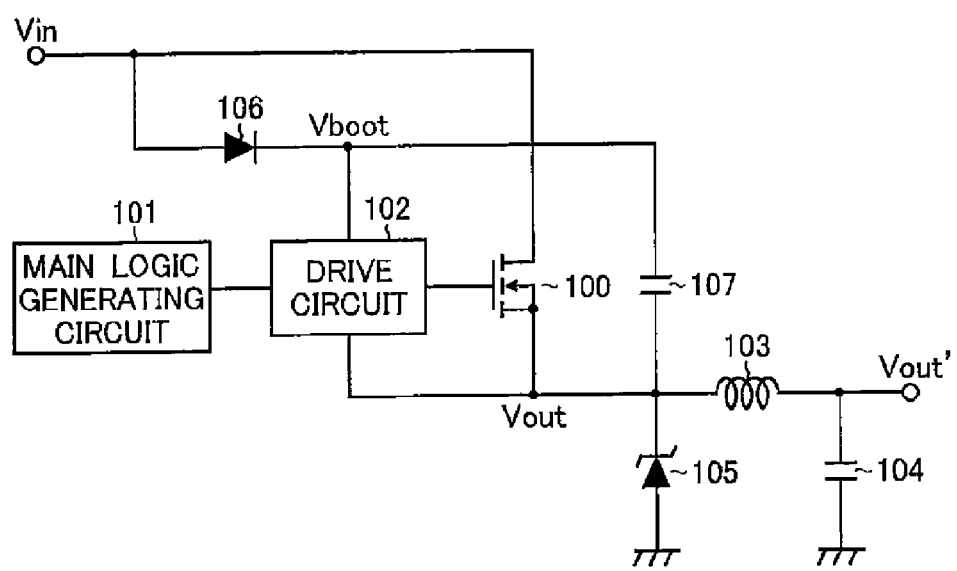
FIG. 21 is a circuit diagram showing a conventional example of the step-down chopper regulator using a bootstrap circuit.

The semiconductor device 1 is made up of integrated elements including an output power transistor (a N-channel LDMOS transistor) N1, an N-channel LDMOS transistor N2 that is a substitute element of a conventional boot diode (see FIG. 21), a main logic generating circuit (a first logic generating circuit) CTRL1, a boot portion control circuit CTRL2a, a back gate control circuit CTRL2b, a level shifting circuit LS, a drive circuit (a first drive circuit) DRV, a sensing resistor Rs, a sensing amplifier AMP, a constant voltage circuit REG, a first switch S1 and a second switch S2.

In addition, the semiconductor device 1 has external terminals including an input terminal T1 to which the input voltage Vin is applied, an output terminal T2 that delivers the output voltage (switch voltage) Vout, a boot terminal T3 that delivers a boot voltage Vboot, a feedback terminal T4 that receives a feedback voltage Vadj varying in accordance with the smooth output voltage Vout'.

A drain of the output power transistor N1 is connected to the input terminal T1 via the sensing resistor Rs. A source and a back gate of the output power transistor N1 are connected to the output terminal T2. A gate of the output power transistor N1 is connected to a gate voltage output terminal of the drive circuit DRV. In other words, the output power transistor N1 works as a first switching element that is connected in series between a terminal to which the input voltage Vin is applied (the input terminal T1) and a leader terminal (the output terminal T2) of the output voltage Vout.

A source and a gate of the LDMOS transistor N2 are connected to the output terminal of the constant voltage circuit REG. Note that the constant voltage circuit REG is a means that generates a desired constant voltage Vs (e.g., approximately 5 volts) from the input voltage Vin with reference to a ground voltage GND, and it can be constituted by using a simple series regulator or the like. A drain of the LDMOS transistor N2 is connected to the boot terminal T3. Note that the first switch S1 is connected between the back gate and the source of the LDMOS transistor N2. In addition, the second switch S2 is connected between the back gate and the drain of the LDMOS transistor N2. The first and the second switches S1 and S2 are controlled to be open or close in accordance with a control signal from the back gate control circuit CTRL2b.

A non-inverting input terminal (+) of the sensing amplifier AMP is connected to a high potential terminal (the input terminal T1 side) of the sensing resistor Rs. An inverting input terminal (−) of the sensing amplifier AMP is connected to a low potential terminal (the output terminal T2 side) of the sensing resistor Rs.

The main logic generating circuit CTRL1 includes a constant voltage source E1, an error amplifier ERR, a comparator CMP, an oscillator OSC, an inverter INV, an SR flip flop FF and a NOT-AND operational unit NAND.

A non-inverting input terminal (+) of the error amplifier ERR is connected to a positive terminal of the constant voltage source E1 (an output terminal of the reference voltage Vref). A negative terminal of the constant voltage source E1 is connected to the ground. An inverting input terminal (−) of the error amplifier ERR is connected to the feedback terminal T4.

A non-inverting input terminal (+) of the comparator CMP is connected to an output terminal of the sensing amplifier AMP (an output terminal of a sensed voltage Vcs). An inverting input terminal (−) of the comparator CMP is connected to an output terminal of the error amplifier ERR.

An output terminal of the oscillator OSC (an output terminal of a clock signal) is connected to a set terminal (S) of the SR flip flop FF via the inverter INV, while it is also connected to an input terminal of the NOT-AND operational unit NAND. A reset terminal (R) of the SR flip flop FF is connected to an output terminal of the comparator CMP. An output terminal (Q) of the SR flip flop FF is connected to another input terminal of the NOT-AND operational unit NAND. An output terminal of the NOT-AND operational unit NAND corresponds to an output terminal of the main logic signal.

The main logic generating circuit CTRL1 having the structure described above generates the main logic signal (a first logic signal) for performing control of turning on and off the output power transistor N1 so that the smooth output voltage Vout' becomes a desired value based on the feedback voltage Vadj and the sensed voltage Vcs.

Note that the main logic signal generated by the NOT-AND operational unit NAND is supplied to the drive circuit DRV via the level shifting circuit LS, while it is also supplied to the boot portion control circuit CTRL2a. In other words, timing control the signal for controlling the output power transistor N1 is performed in synchronization with that of the signal for controlling the back gate of the LDMOS transistor N2.

High voltage terminals of the level shifting circuit LS and the drive circuit DRV are both connected to the boot terminal T3, while low voltage terminals of them are both connected to the output terminal T2. In other words, the level shifting circuit LS performs level shifting of the main logic signal by using the boot voltage Vboot, and the drive circuit DRV performs control of turning on and off of the output power transistor N1 (control of generating the gate voltage) by using the boot voltage Vboot based on the above-mentioned level shifted main logic signal.

Outside the semiconductor device 1, the boot capacitor C2 is connected externally between the output terminal T2 and the boot terminal T3.

In addition, outside the semiconductor device 1, the output terminal T2 is connected to one end of the output inductor L1, while it is also connected to the cathode of the Schottky barrier diode SBD. The other end of the output inductor L1 is connected to the load (not shown), while it is also connected to the ground via the output capacitor C1. The anode of the Schottky barrier diode SBD is connected to the ground. In this way, the step-down chopper regulator of the present embodiment has the structure in which the output voltage Vout having a rectangular waveform is smoothed by using the smoothing circuit (L1, C1 and SBD) that is connected externally between the output terminal T2 and the load (not shown), so that the desired smooth output voltage Vout' is generated.

In addition, outside the semiconductor device 1, the feedback terminal T4 is connected to a high potential terminal of the output capacitor C1 (the output terminal of the smooth output voltage Vout') via a resistor R1, while it is also connected to the ground via a resistor R2. Therefore, the resistors R1 and R2 work as a voltage dividing circuit for generating the feedback voltage Vadj that varies in accordance with the smooth output voltage Vout' from the connection node thereof.

Furthermore, in the step-down chopper regulator having the structure described above, the LDMOS transistor N2, the first and the second switches S1 and S2, the boot portion control circuit CTRL2a, the back gate control circuit CTRL2b and the boot capacitor C2 connected externally constitute the bootstrap circuit that receives the constant voltage Vs and generates the boot voltage Vboot having higher potential than the output voltage Vout. Among them, the boot portion control circuit CTRL2a and the hack gate control circuit CTRL2b work as the bootstrap control circuit that performs back gate control of the LDMOS transistor N2 (control of turning on and off the first and the second switches S1 and S2) in accordance with the main logic signal and performs control of turning on and off the LDMOS transistor N2.

Next, a structure of the LDMOS transistor will be described in detail with reference to FIG. 2.

Figure 2:
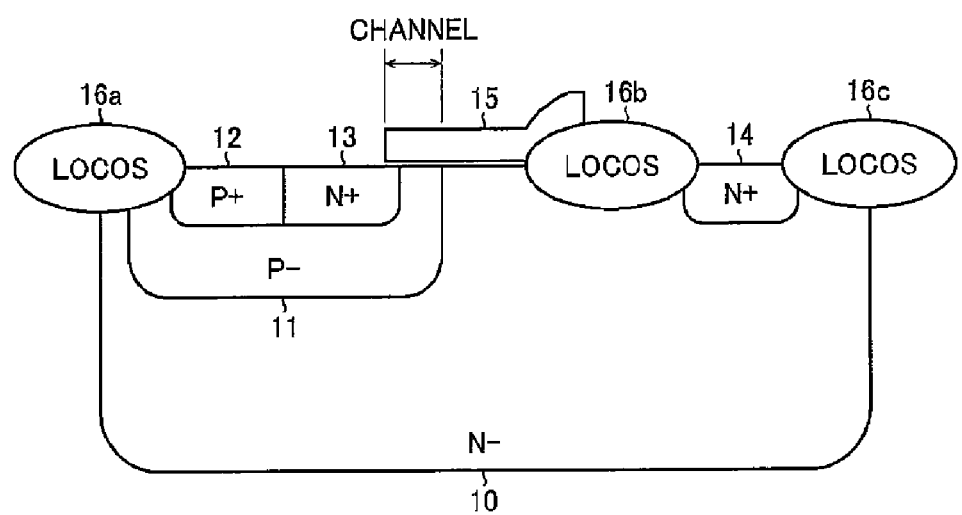
FIG. 2 is a longitudinal section for explaining a structure of an LDMOS transistor.

FIG. 2 is a longitudinal section for explaining a structure of the LDMOS transistor.

As shown in FIG. 2, a low density P-type diffusion region 11 is formed within a low density N-type diffusion region 10. A high density P-type diffusion region 12 for making the back gate of the LDMOS transistor and a high density N-type diffusion region 13 corresponding to the source of the LDMOS transistor are formed within the low density P-type diffusion region 11. In addition, a high density N-type diffusion region 14 corresponding to the drain of the LDMOS transistor is formed within the low density N-type diffusion region 10. Note that the low density P-type semiconductor region 11 and the high density N-type semiconductor region 14 are formed with a predetermined space in the lateral direction, and further a local oxidation of silicon (LOCOS) layer 16 is formed between them. In addition, a gate electrode 15 is formed on the surface of the low density N-type semiconductor region 10 so as to cover from an end portion of the high density N-type semiconductor region 13 to the low density P-type semiconductor region 11, the low density N-type semiconductor region 10 and apart of the LOCOS layer 16.

The LDMOS transistor is a device that is made for a purpose of reducing on-resistance with respect to an element that requires to enhance its drain withstand voltage, and it has the structure as described above, in which individual electrodes are diffused in the lateral direction so that electric field strength between the drain and the gate is decreased. Therefore, it is general that although the withstand voltage of the drain is high, the withstand voltages of the gate and the source are low (for example, the withstand voltage of the drain is approximately 30-60 volts, while the withstand voltages of the gate and the source are approximately 7-8 volts).

On the other hand, since a potential up to Vin−Vds(N1)+(Vs−Vsd(N2)+Vf) is applied to the boot terminal T3 as described later in detail, high or middle withstand voltage is necessary as withstand voltage of the terminal connected to the boot terminal T3. Note that the above-mentioned Vf denotes a forward drop voltage of the Schottky barrier diode SBD, Vds(N1) denotes a drain-source drop voltage of the output power transistor N1, Vs denotes an internal constant voltage, and Vsd(N2) denotes a source-drain voltage of the LDMOS transistor.

Therefore, as to the LDMOS transistor N2, the drain having a higher withstand voltage is connected to the boot terminal T3 (the high potential side of the bootstrap circuit), and the source and the gate having a lower withstand voltage are connected to the output terminal of the constant voltage circuit REG (low potential side of the bootstrap circuit). In other words, the LDMOS transistor N2 connected in the opposite direction (with opposite bias) between the output terminal and the boot terminal T3 of the constant voltage circuit REG.

According to this structure, the LDMOS transistor N2 is turned off when the output power transistor N1 is turned on, while the LDMOS transistor N2 is turned on when the output power transistor N1 is turned off, so as to realize the same function as the conventional boot diode (see FIG. 21) instead of the same. Therefore, it is able to support high-speed oscillation without an expensive BiCDMOS process.

In addition, since the constant voltage circuit REG is provided for generating the desired constant voltage Vs from the input voltage Vin with reference to the ground voltage GND, it is able to realize stable step-down chopping action having a wide input voltage range.

Note that instead of the above-mentioned reverse direction LDMOS transistor N2, a high or middle withstand voltage transistor having a back gate that can be separated from the substrate may be used as a substitute element of the boot diode. In this case, however, there is a disadvantage in its area because it is necessary to design so that the on-resistance becomes small.

Next, a bootstrap action of the step-down chopper regulator having the above-mentioned structure will be described in detail with reference to FIG. 3.

Figure 3:
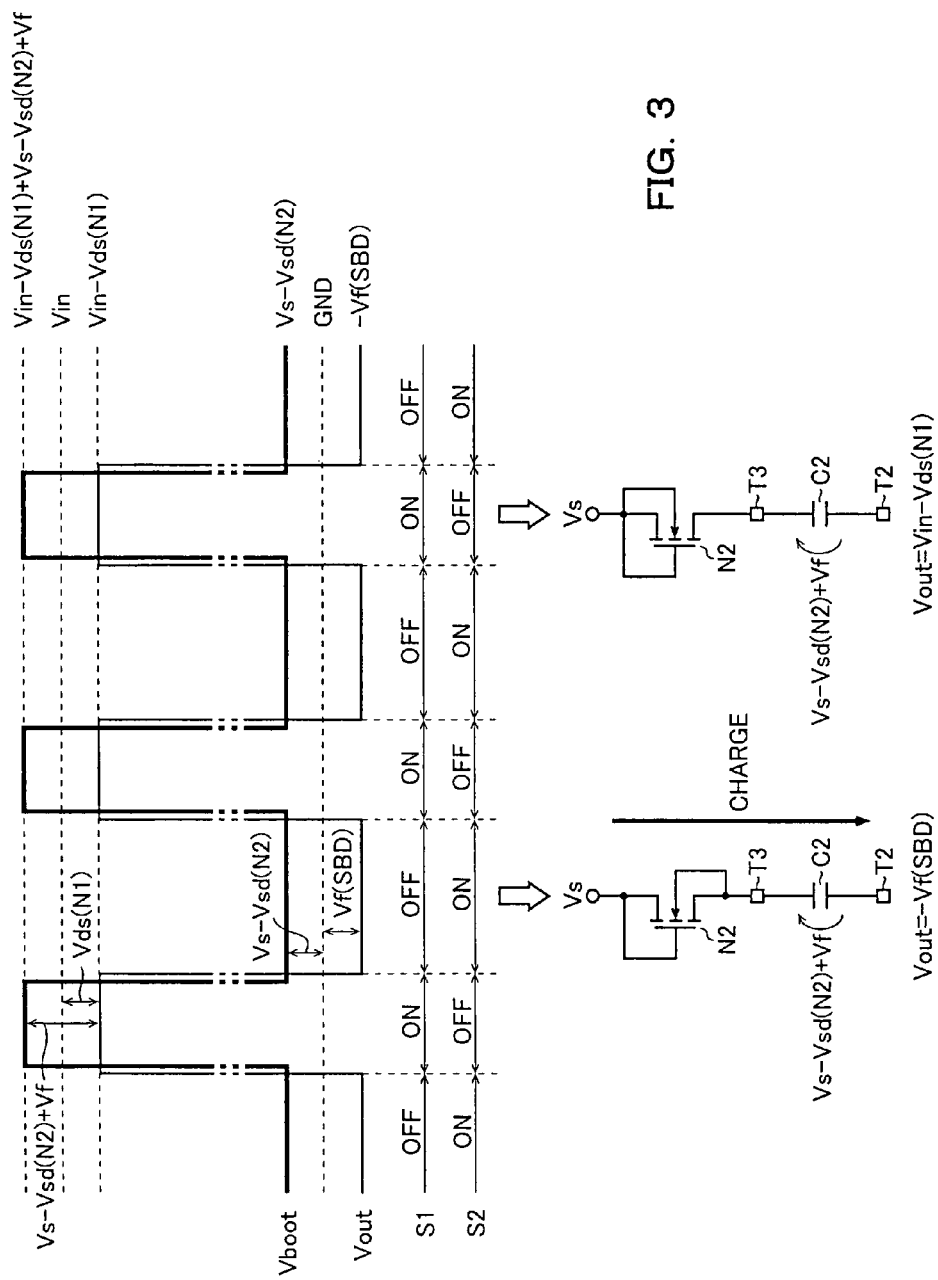
FIG. 3 is a timing chart for explaining a bootstrap action in the first embodiment.

FIG. 3 is a timing chart for explaining the bootstrap action in the first embodiment. The solid line in FIG. 3 indicates behavior of the output voltage Vout, and the thick solid line indicates behavior of the boot voltage Vboot. Note that although logical change timings of the output voltage Vout and the boot voltage Vboot are shifted from each other for easy understanding of their potential relationship in FIG. 3, the logical change timings of them are actually the same timing. In addition, the reference signs S1 and S2 indicate on and off states of the first and the second switches S1 and S2, respectively. Note that FIG. 3 shows the case where their on and off states are reversed completely for simple description.

When the output power transistor N1 is controlled to be switched from on to off, the first switch S1 is turned off while the second switch S2 is turned on in synchronization with it. As a result, the constant voltage Vs is applied to the gate and the source of the LDMOS transistor N2, while the boot voltage Vboot is applied to the drain and the back gate of the LDMOS transistor N2. Therefore, the LDMOS transistor N2 is turned on in the reverse direction, and the boot capacitor C2 is charged by using the constant voltage Vs.

In this case, a potential difference that is obtained by subtracting the source-drain drop voltage Vsd(N2) of the LDMOS transistor N2 from the constant voltage Vs is generated between both end of the boot capacitor C2. Therefore, the boot voltage Vboot becomes a voltage value (Vs−Vsd(N2)) that is increases from the output voltage Vout (=−Vf) by the charged voltage of the boot capacitor C2 (Vs−Vsd(N2)+Vf).

On the other hand, when the output power transistor N1 is controlled to be switched from off to on, the first switch St is turned on while the second switch S2 is turned off in synchronization with it. As a result, the constant voltage Vs is applied to the gate, the source and the back gate of the LDMOS transistor N2, so that the LDMOS transistor N2 is turned off.

In this case, the output voltage Vout is increased up to a voltage obtained by subtracting the drain-source drop voltage Vds(1) of the output power transistor N1 from the input voltage Vin accompanying the turning on of the output power transistor N1, but a potential difference (Vs−Vsd(N2)+Vf) generated by the previous charging is sustained between the both ends of the boot capacitor C2. Therefore, the boot voltage Vboot becomes a voltage value (Vin−Vds(N1)+Vs−Vsd(N2)+Vf) that is increased from the output voltage Vout (=Vin−Vds(N1)) by the charged voltage of the boot capacitor C2 (Vs−Vsd(N2)+Vf).

As described above, the bootstrap circuit of the present embodiment controls the back gate of the LDMOS transistor N2 so as to perform control of turning on and off the same and generates the boot voltage Vboot that is normally higher than the output voltage Vout. According to this structure, it is able to perform control of turning on and off the LDMOS transistor N2 with a simple structure, so that an appropriate bootstrap action can be realized.

Figure 4:
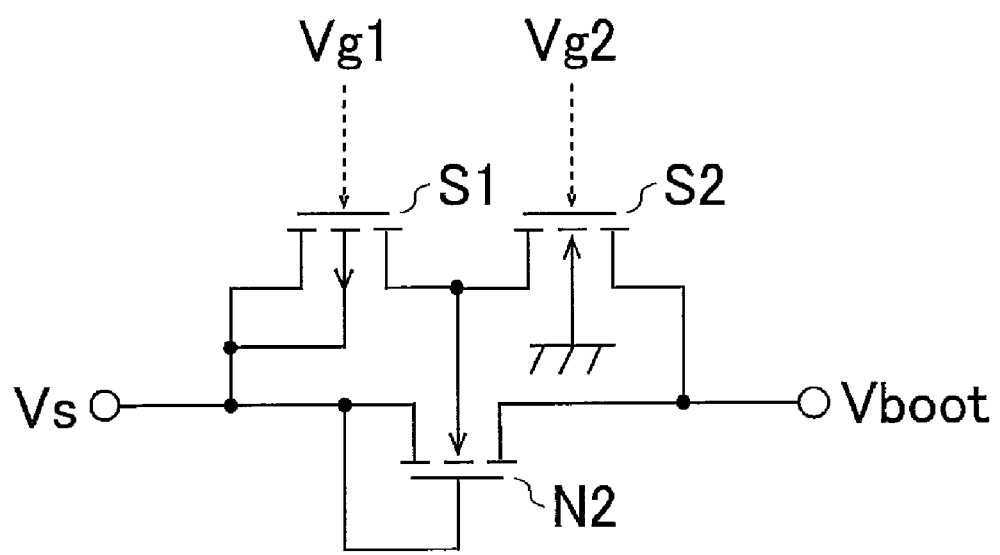
FIG. 4 is a circuit diagram showing a concrete structure of switches S1 and S2.
Figure 5:
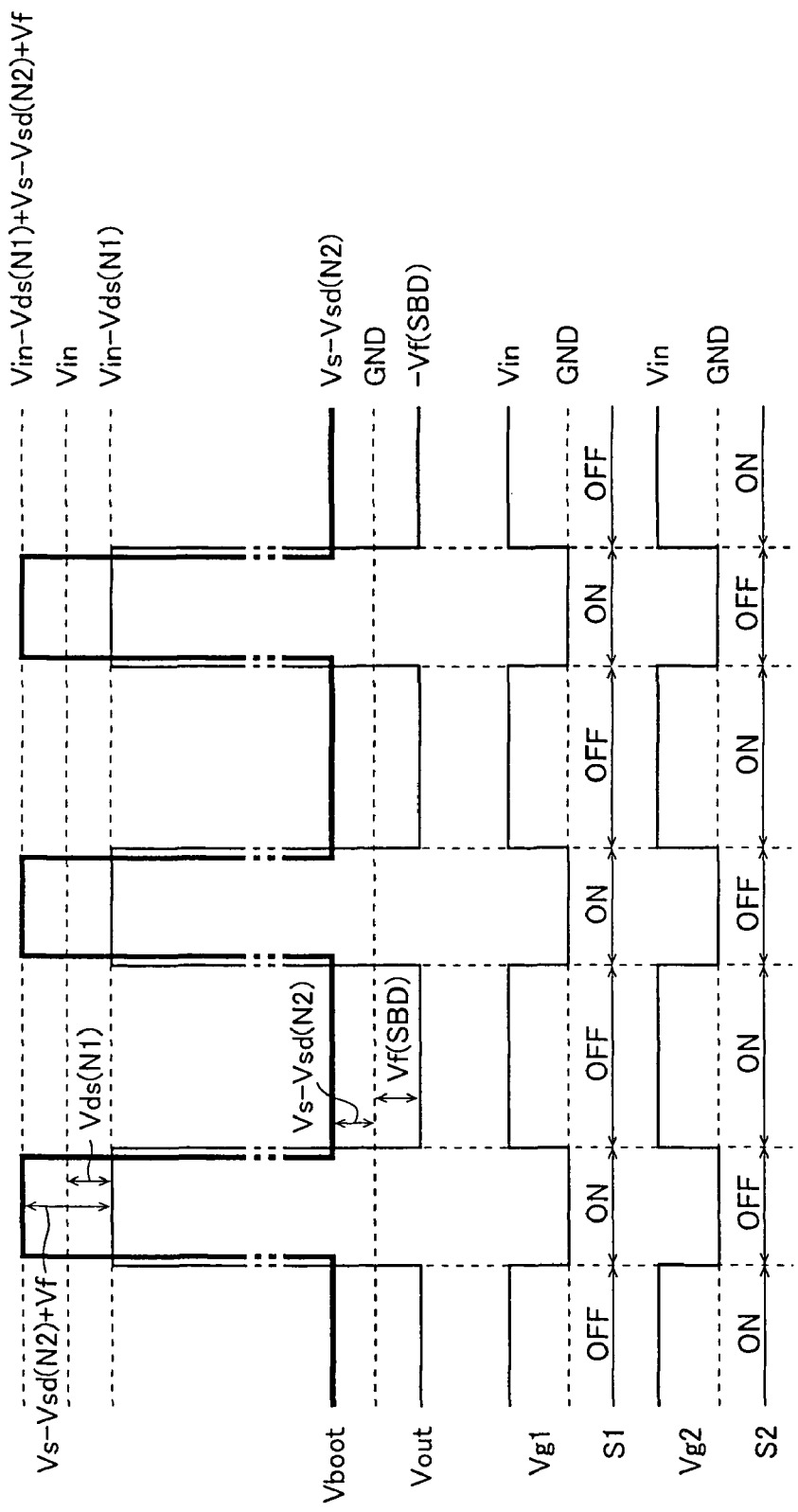
FIG. 5 is a timing chart showing an example of gate voltages Vg1 and Vg2.

FIG. 4 is a circuit diagram showing a concrete structure of the switches S1 and S2. Furthermore, FIG. 5 is a timing chart showing an example of the gate voltages Vg1 and Vg2.

As shown in FIG. 4, the semiconductor device 1 of the present embodiment preferably has a structure in which the first switch S1 is a P-channel MOS transistor while the second switch S2 is an N-channel MOS transistor. The reason why a P-channel MOS transistor is used as the first switch S1 while an N-channel MOS transistor is used as the second switch S2 is that since the back gate voltage of the LDMOS transistor N2 is controlled, switch action cannot be achieved if the source is connected to the back gate of the LDMOS transistor N2.

Furthermore, when this structure is adopted, the back gate of the MOS transistor that is used as the first switch S1 should be connected to the output terminal of the constant voltage circuit REG while the back gate of the MOS transistor that is used as the second switch S2 should be connected to the ground terminal.

In addition, the first and the second switches S1 and S2 are preferably middle withstand voltage elements having the withstand voltage within the range of 7-40 volts or high withstand voltage element having the withstand voltage within the range of 40-60 volts, since high voltage is applied to them.

According to this structure, it is able to perform control of turning on and off the first and the second switches S1 and S2 with the simple structure by using the boot portion control circuit CTRL2a and the back gate control circuit CTRL2b for generating the gate voltages Vg1 and Vg2 in synchronization with the main logic signal (see FIG. 5).

Note that although FIG. 5 shows the case where logical change timings of the gate voltages Vg1 and Vg2 are the same timing, the on/off states of the first and the second switches S1 and S2 change simultaneously in this gate voltage control. Therefore, there is a case having a period while the first and the second switches S1 and S2 are turned on simultaneously. This simultaneous on period is very short like 1 nanosecond or less. However, if the source and the drain of the LDMOS transistor N2 pass through when the output power transistor N1 is turned on and the output voltage out is Vin−Vds(N1), a low withstand voltage circuit (having a withstand voltage of 6 volts or lower) such as the drive circuit DRV driven by the constant voltage Vs may be broken down.

Figure 6:
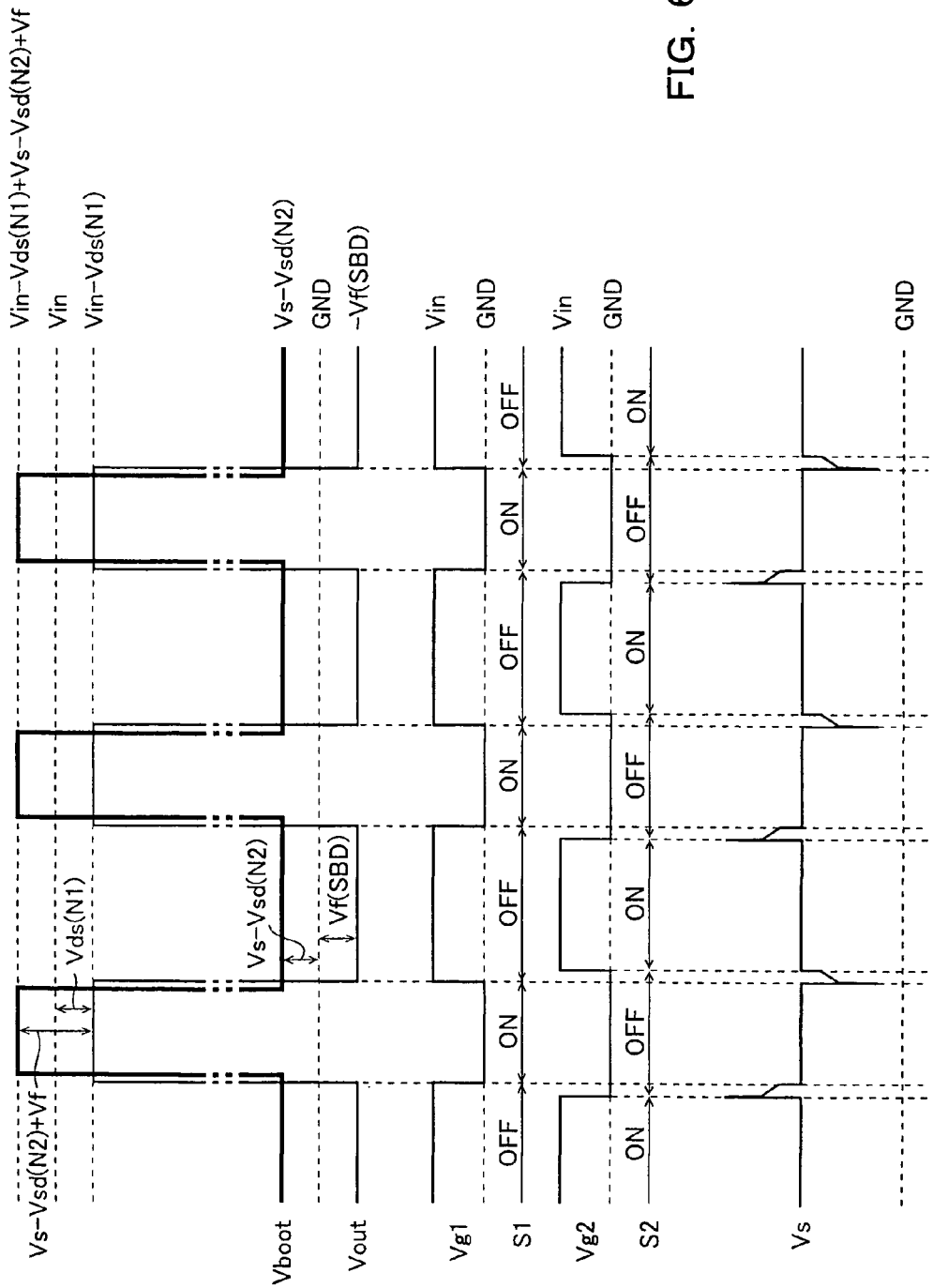
FIG. 6 is a timing chart in the case of providing a period while the switches S1 and S2 are turned off simultaneously.

Therefore, it is preferable that the boot portion control circuit CTRL2a and the back gate control circuit CTRL2b perform control of turning on and off the first and the second switches S1 and S2 so as to have a period while both the first and the second switches S1 and S2 are tuned off as shown in FIG. 6 (the timing chart in the case having the period while both the switches S1 and S2 are turned off simultaneously). In other words, the boot portion control circuit CTRL2a and the back gate control circuit CTRL2b preferably have the structure including a timing control circuit (a delay circuit) and a level shifting circuit for generating the gate voltages Vg1 and Vg2 shown in FIG. 6 from the main logic signal.

According to this structure, it is able to avoid breakdown of a low withstand voltage circuit (having a withstand voltage of 6 volts or lower) by eliminating the period while the first and the second switches S1 and S2 are turned on simultaneously.

However if there is the above-mentioned period while the first and the second switches S1 and S2 are turned off simultaneously, the constant voltage Vs may have noise. In addition, noise due to the boot voltage Vboot may be generated in the constant voltage Vs via parasitic capacitance of the LDMOS transistor N2. If such noise is added to the constant voltage Vs, a low withstand voltage circuit (having withstand voltage of 6 volts or lower) such as the drive circuit DRV driven by the constant voltage Vs may be broken down.

Figure 7:
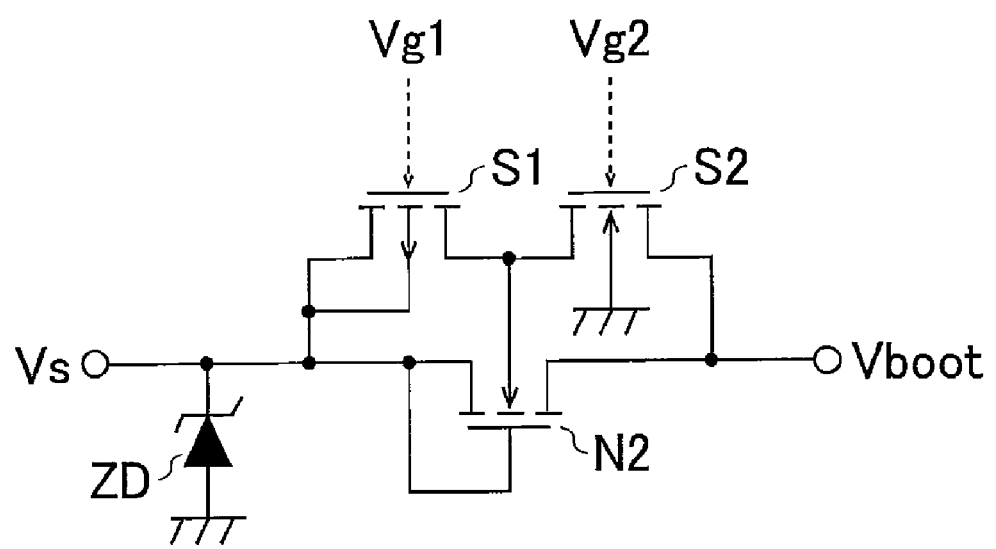
FIG. 7 is a circuit diagram showing an example of a noise suppressing portion.

Therefore, as a means that suppresses the above-mentioned noise, it is preferable to provide a zener diode ZD having a cathode connected to the output terminal of the constant voltage circuit REG and an anode connected to the ground as shown in FIG. 7 (the circuit diagram showing an example of the noise suppressing portion).

Figure 8:
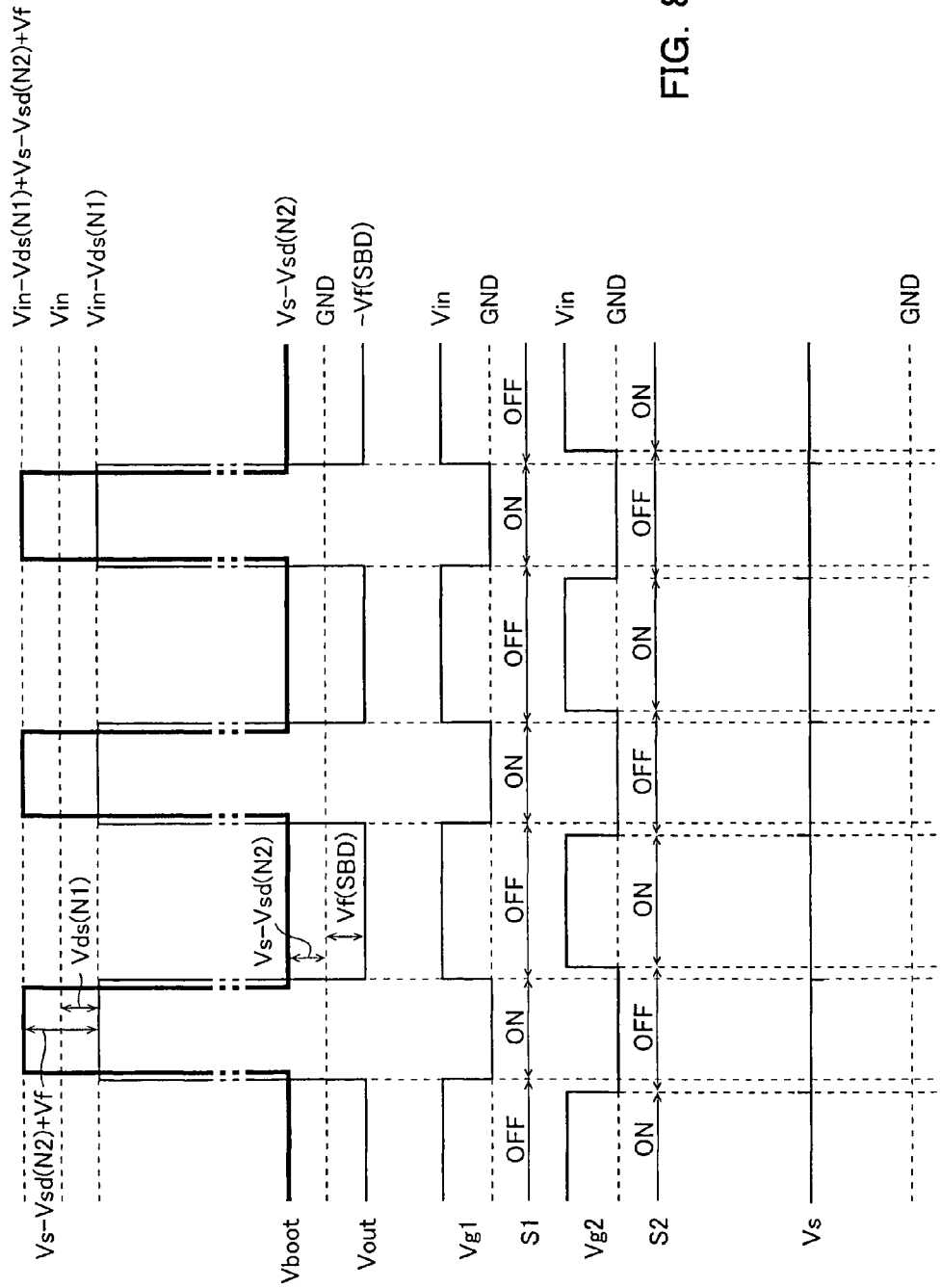
FIG. 8 is a timing chart for explaining a noise suppression effect.

According to this structure, the noise added to the constant voltage Vs is suppressed as the waveform shown in FIG. 8 (the timing chart for explaining the noise suppression effect). Therefore, breakdown of the low withstand voltage circuit (having withstand voltage of 6 volts or lower) can be avoided.

Figure 9:
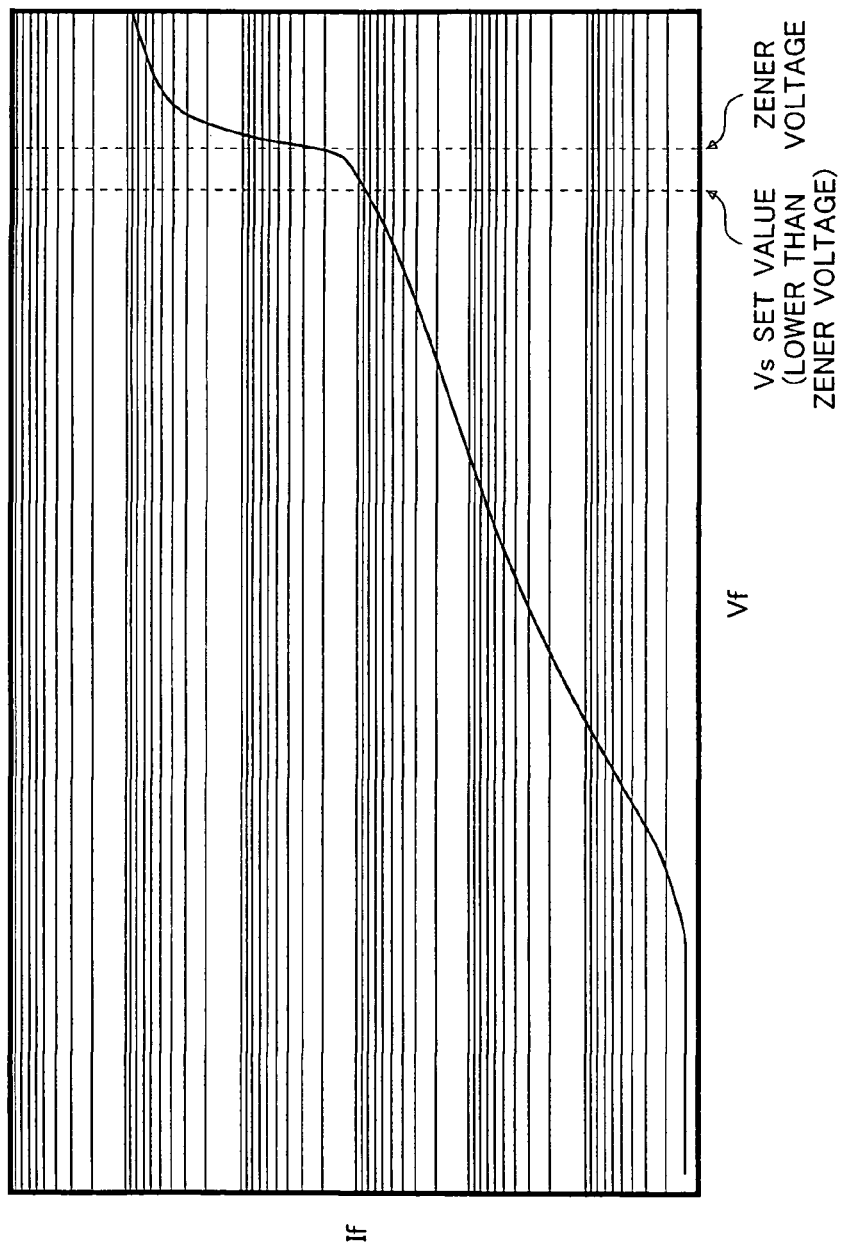
FIG. 9 shows characteristics of a zener diode ZD.

FIG. 9 shows characteristic of the zener diode ZD and is a diagram for explaining a relationship between a zener voltage and a set value of the constant voltage Vs.

As shown in FIG. 9, the constant voltage Vs is preferably set to a voltage value lower than the zener voltage of the zener diode ZD utilizing a structure in which the low withstand voltage circuit connected to the constant voltage Vs is prevented from being broken down by the zener diode ZD, and such a voltage value that the gate voltage (=Vs−Vsd(N2)) of the output power transistor N1 can be as large as possible.

In other words, it is preferable to set the constant voltage Vs of the step-down chopping regulator of the present embodiment to an upper limit voltage value that is lower than the gate withstand voltage of the LDMOS transistor N2 and is such a voltage value that the source-drain drop voltage of the LDMOS transistor N2 (=Vs−Vsd(N2)+Vf) becomes lower than the withstand voltage of the drive circuit DRV.

As to the structure using the zener diode ZD, the constant voltage Vs is preferably set to a value lower than the zener voltage by a little (approximately 0.1-0.2 volts).

According to this setting, a voltage that is as high as possible can be applied to the gate of the output power transistor N1. Therefore, the on-resistance of the output power transistor N1 can be reduced so that conversion efficiency of the high voltage chopping regulator can be improved. In addition, if the conversion efficiency is set to a constant value, the output power transistor N1 can be designed to be small, so that the chip size as well as the cost can be reduced.

On the other hand, since a variation of the source-drain drop voltage Vsd of the LDMOS transistor N2 is large, the constant voltage Vs is required to be set with a margin considering the above-mentioned fact (set to a lower value with a sufficient safety margin) in order to avoid a breakdown of a low withstand voltage circuit (having a withstand voltage of 6 volts or lower). Therefore, in the first embodiment described above, the charged voltage of the boot capacitor C2 is suppressed so that the efficiency of the output power transistor N1 cannot be exerted at most and that the on-resistance cannot be minimized.

Next, a second embodiment of the step-down chopper regulator according to the present invention will be described in detail.

Figure 10:
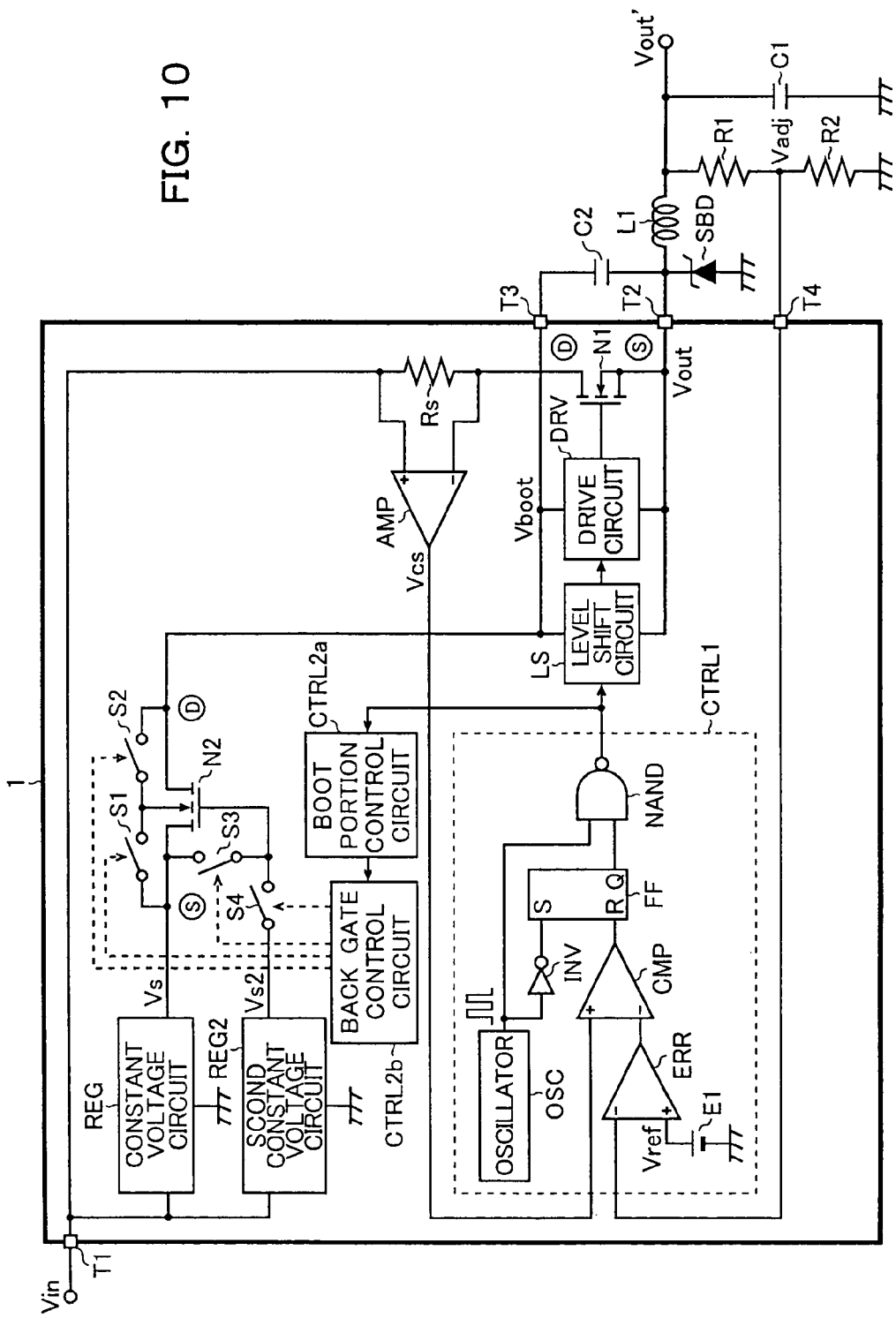
FIG. 10 is a block diagram showing a second embodiment of the step-down chopper regulator according to the present invention.

FIG. 10 is a block diagram showing a second embodiment of the step-down chopper regulator according to the present invention.

Note that the step-down chopper regulator of the present embodiment has substantially the same structure as the first embodiment described above. Therefore, parts similar to the first embodiment are denoted by the same reference signs as those in FIG. 1 so that the descriptions thereof will be omitted. Only the characteristic portions of the present embodiment will be described mainly in the following explanation.

As shown in FIG. 10, the semiconductor device 1 of the step-down chopper regulator in the present embodiment includes a second constant voltage circuit REG2 that generates a second constant voltage Vs2 (here, the gate withstand voltage of the LDMOS transistor N2) that is higher than the constant voltage Vs from the input voltage Vin with reference to the ground voltage GND. In addition, the bootstrap control circuit includes the first and the second switches S1 and S2 described above as well as a third switch S3 connected between the gate and the source of the LDMOS transistor N2 and a fourth switch S4 connected between the gate of the LDMOS transistor N2 and the output terminal of the second constant voltage circuit REG2. Further, the boot portion control circuit CTRL2a and the back gate control circuit CTRL2b perform control of turning on and off the first to the fourth switches S1-S4 in accordance with the main logic signal.

Figure 11:
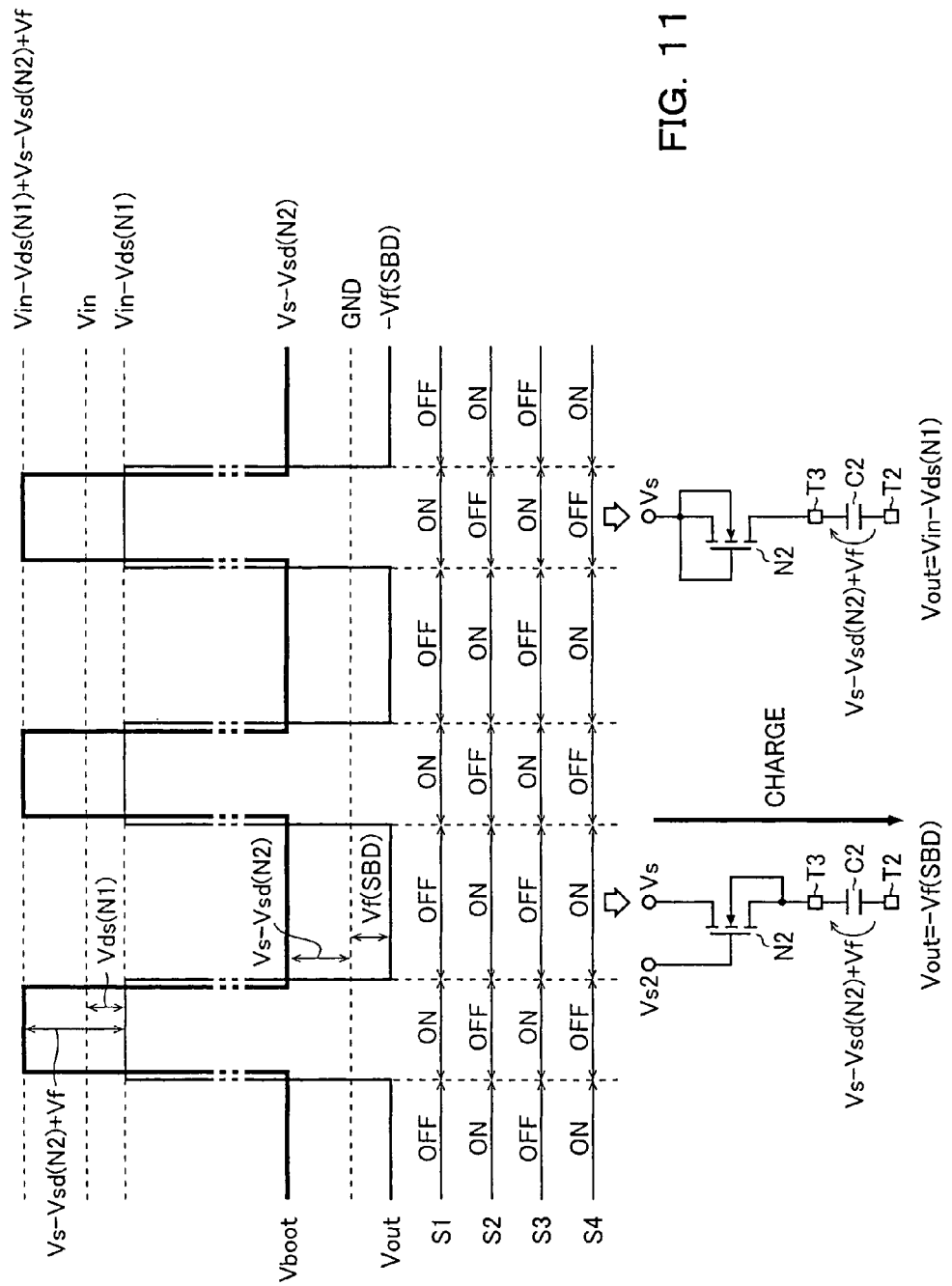
FIG. 11 is a timing chart for explaining the bootstrap action in the second embodiment.

FIG. 11 is a timing chart for explaining the bootstrap action in the second embodiment.

As shown in FIG. 11, when the output power transistor N1 is controlled to switch from on to off the first and the third switches S1 and S3 are turned off while the second and the fourth switches S2 and S4 are turned on in synchronization with it. As a result, the constant voltage Vs is applied to the source of the LDMOS transistor N2, and the second constant voltage Vs2 is applied to the gate of the LDMOS transistor N2, the boot voltage Vboot is applied to the drain and the back gate of the LDMOS transistor N2. Therefore, the LDMOS transistor N2 is turned on in the reverse direction, and the boot capacitor C2 is charged by using the constant voltage Vs.

In this case, the LDMOS transistor N2 is in a fully turned-on state since the second constant voltage Vs2 is applied to the gate. Therefore, a potential difference obtained by subtracting the source-drain drop voltage Vsd(N2) of the LDMOS transistor N2 from the constant voltage Vs is generated between the both terminals of the boot capacitor C2. Therefore, the boot voltage Vboot becomes a voltage value (Vs−Vsd(N2)) that is higher than the output voltage Vout (=−Vf) by the charged voltage of the boot capacitor C2 (Vs−Vsd(N2)+Vf).

On the other hand, when the output power transistor N1 is controlled to switch from off to on, the first and the third switches S1 and S3 are turned on while the second and the fourth switches S2 and S4 are tuned off in synchronization with it. As a result, the constant voltage Vs is applied to the gate, the source and the back gate of the LDMOS transistor N2 so that the LDMOS transistor N2 is turned off.

In this case, the output voltage Vout is increased up to a voltage obtained by subtracting the drain-source drop voltage Vds(N1) of the output power transistor N1 from the input voltage Vin when the output power transistor N1 is turned on. The boot capacitor C2 keeps the potential difference (Vs−Vsd(N2)+Vf) between both ends that was generated by the previous charging. Therefore, the boot voltage Vboot becomes a voltage value (Vin−Vds(N1)+Vs−Vsd(N2)+Vf) that is higher than the output voltage Vout(=Vin−Vds(N1)) by the charged voltage of the boot capacitor C2 (Vs−Vsd(N2)+Vf).

In this way, the structure of the second embodiment including the two types of constant voltages Vs and Vs2 can cancel the influence of the variation in the source-drain drop voltage Vsd(N2) of the LDMOS transistor N2 by setting the boot voltage Vboot to (Vin−Vds(N1)+Vs−Vsd(N2)+Vf).

In addition, since a few milliamperes of current flows for charging the boot capacitor C2, the boot voltage Vboot that is supplied to the drive circuit DRV can be set to a large value by setting the second constant voltage Vs2 to the gate withstand voltage of the LDMOS transistor N2 so as to lower the source-drain drop voltage Vsd(N2) of the LDMOS transistor N2 as much as possible. Note that Vsd(N2) in the first embodiment is approximately 1 volt while the Vsd(N2) in the second embodiment is approximately 0.3 volts.

In other words, although only a small potential difference can be applied by the drive circuit DRV in the structure of the first embodiment, more potential difference can be applied in the structure of the second embodiment.

Therefore, the structure of the second embodiment can enhance the gate voltage of the output power transistor N1 to the upper limit value of its withstand voltage. Thus, it is able to exert the efficiency of the output power transistor N1 at the maximum so that its on-resistance is reduced to the minimum value and that a variation of the conversion efficiency can be suppressed.

Next, a third embodiment of the step-down chopper regulator according to the present invention will be described in detail.

Figure 12:
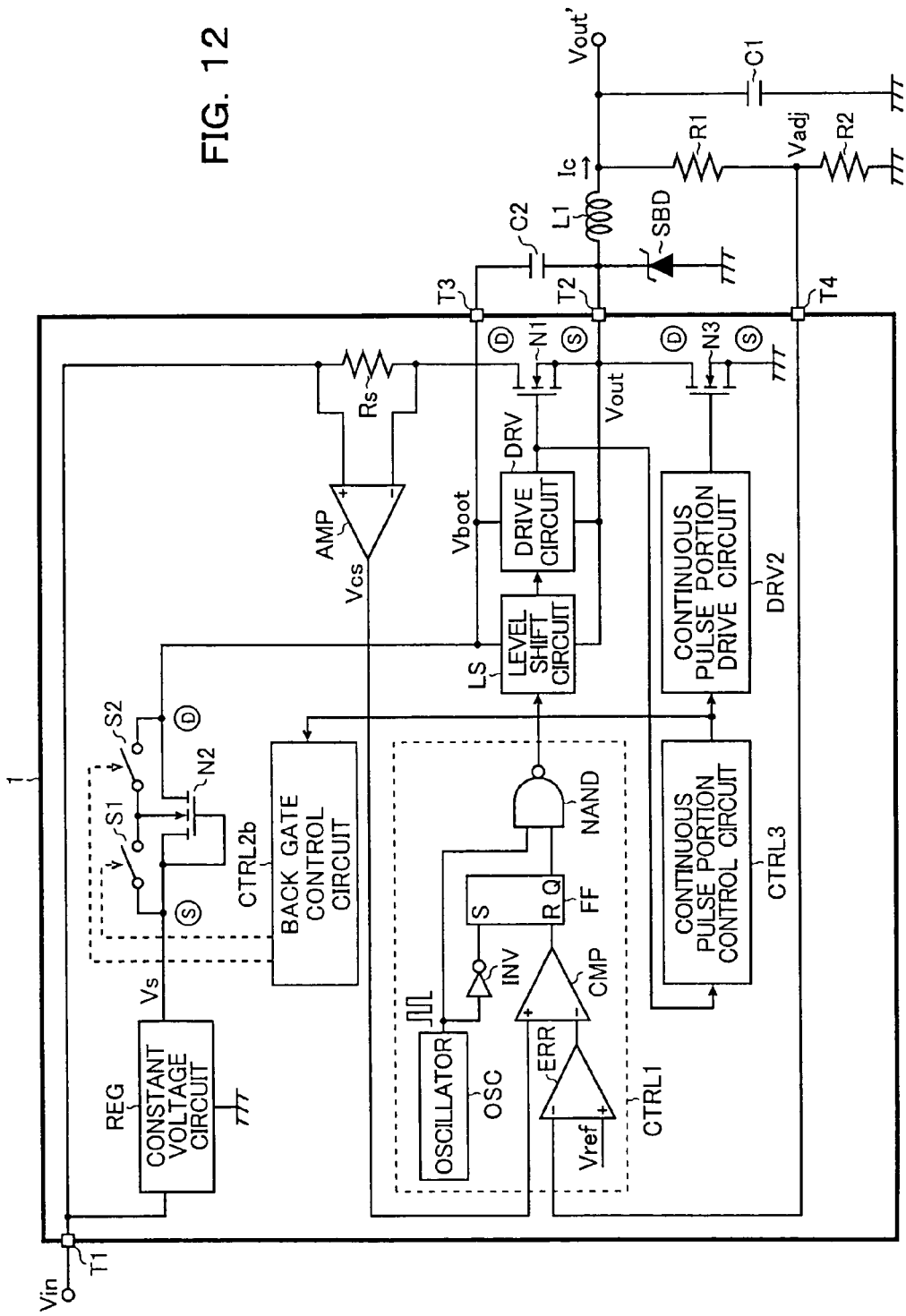
FIG. 12 is a diagram showing a third embodiment of the step-down chopper regulator according to the present invention.

FIG. 12 is a diagram showing a third embodiment of the step-down chopper regulator according to the present invention.

Note that the step-down chopper regulator of the present embodiment has a structure that is substantially the same as that in the first embodiment. Therefore, parts similar to the first embodiment are denoted by the same reference signs as those in FIG. 1 so that the descriptions thereof will be omitted. Only the characteristic portions of the present embodiment will be described mainly in the following explanation.

Adding to the structural elements in the first embodiment, the semiconductor device 1 further includes a continuous pulse driving transistor (an N-type LDMOS transistor) N3, a continuous pulse portion control circuit (a second logic generating circuit) CTRL3 and a continuous pulse portion drive circuit (a second drive circuit) DRV2 that are integrated. On the other hand, the boot portion control circuit CTRL2a is eliminated.

The drain of the continuous pulse driving transistor N3 is connected to the output terminal T2. The source and the back gate of the continuous pulse driving transistor N3 are connected to the ground terminal. The gate of the continuous pulse driving transistor N3 is connected to the gate voltage output terminal of the continuous pulse portion drive circuit DRV2. In other words, the continuous pulse driving transistor N3 works as a second switching element connected in series between the leader terminal of the output voltage Vout (the output terminal T2) and the ground terminal.

The main logic signal generated by the main logic generating circuit CTRL1 is supplied to only the drive circuit DRV via the level shifting circuit LS.

The continuous pulse portion control circuit CTRL3 generates a second logic signal from an output signal of the drive circuit DRV (a gate signal of the output power transistor N1), and the second logic signal is also supplied to the continuous pulse portion drive circuit DRV2. On the other hand, it is also supplied to the back gate control circuit CTRL2b. In other words, the signal for controlling the output power transistor N1, the signal for controlling the continuous pulse driving transistor N3 and the signal for controlling the back gate of the LDMOS transistor N2 are synchronized with each other for their timing controls.

Next, a continuous mode and a discontinuous mode of the bootstrap action will be described with reference to FIGS. 13A and 13B.

Figure 13A:
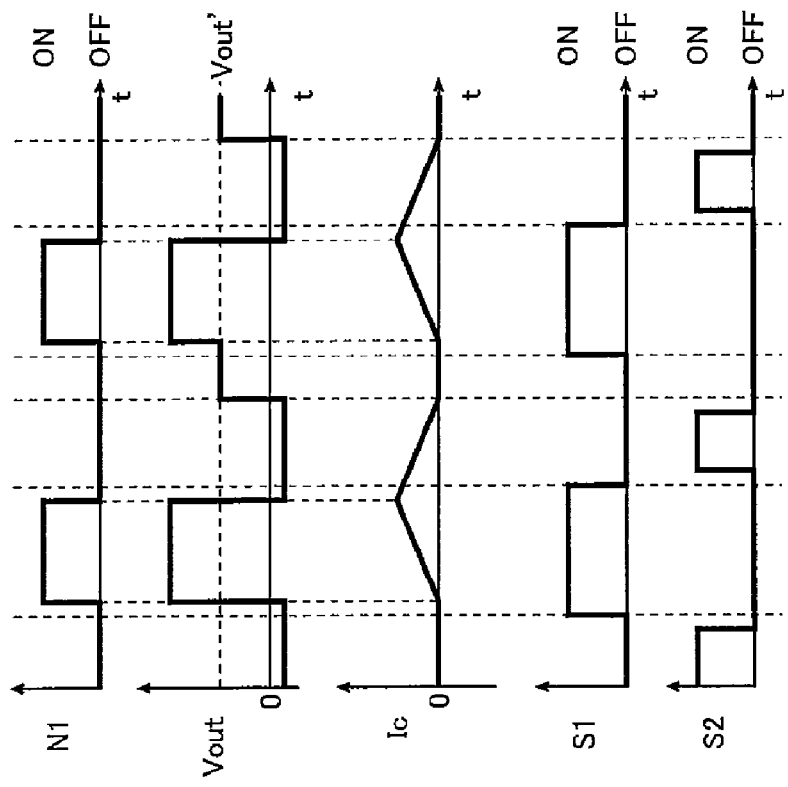
FIGS. 13A and 13B are timing charts for explaining a continuous mode and a discontinuous mode of the bootstrap action.
Figure 13B:
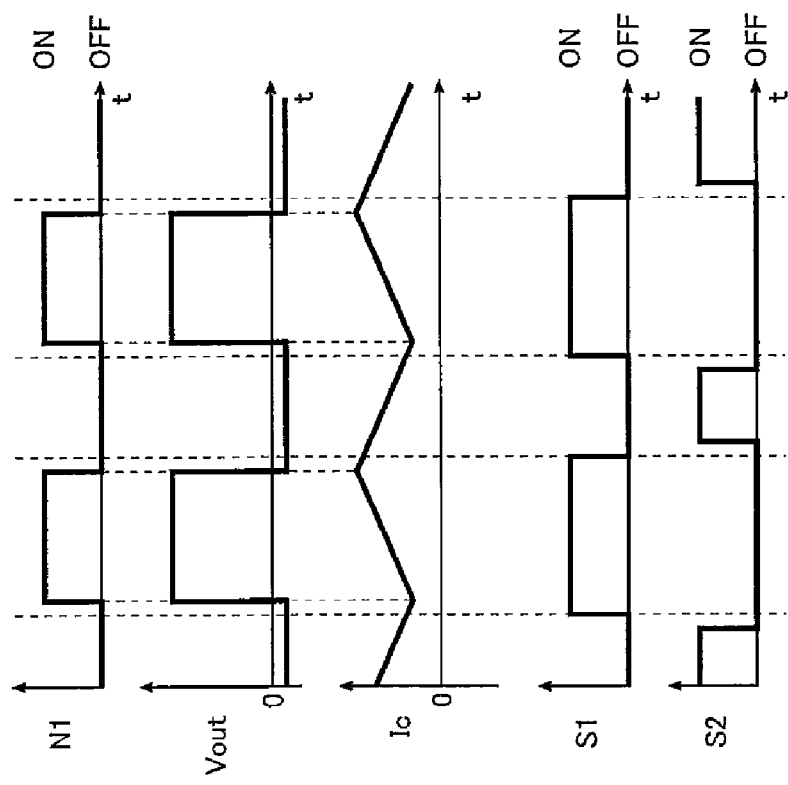

FIGS. 13A and 13B are timing charts for explaining a continuous mode and a discontinuous mode of the bootstrap action. Note that FIG. 13A shows a timing chart in the continuous mode while FIG. 13B shows a timing chart in the discontinuous mode. Reference signs N1, Vout, Ic, S1 and S2 in FIGS. 13A and 13B show an on/off state of the output power transistor N1, behavior of the output voltage Vout, behavior of the coil current Ic and on/off states of the first and the second switches S1 and S2, respectively.

As shown in FIG. 13A, rectangular waveforms appears continuously as the output voltage Vout in the continuous mode of the bootstrap action. In order to maintain this continuous mode of the bootstrap action, a necessary condition as to timing for switching the back gate voltage of the LDMOS transistor N2 is that the second switch S2 is not turns on when the waveform of the output voltage Vout is a high potential (H level) (Condition (1)), and that the first switch S1 and the second switch 82 are not turned on simultaneously (Condition (2)). In addition, a condition that is preferably satisfied for securing the bootstrap action is that the first switch S1 is turned on before the waveform of the output voltage Vout becomes a high potential (H level) (Condition (3)), and that a period of turning on the second switch S2 is as long as possible within a range that satisfies the above-mentioned conditions (1)-(3) (Condition (4)).

On the other hand, if the coil current Ic is decreased as a whole due to a light load or the like, the output voltage Vout increases up to the potential of the smooth output voltage Vout' at a time point when the coil current Ic becomes zero as shown in FIG. 13B. Therefore, the bootstrap action falls into the discontinuous mode so that distortion occurs in the waveform of the output voltage Vout. In this case, if the second switch S2 is in the on state, the above-mentioned condition (1) cannot be satisfied. Therefore, the boot capacitor C2 is discharged so that the charged voltage (as well as the boot voltage Vboot) is reduced resulting in an undesired state. However, the timing when the waveform of the output Vout increases up to the high potential (the high level) (i.e., the timing when the coil current Ic becomes zero) is determined by an external factor such as a load condition or the like. Therefore, it is difficult to determine it uniquely, so it is difficult to turn off the second switch S2 assuming the timing.

Therefore, the step-down chopper regulator of the present embodiment includes a means that avoids a malfunction of the bootstrap action due to the discontinuous mode, which is a continuous pulse driving transistor N3 connected in series between the output terminal T2 and the ground terminal. This is driven at the timing opposite to the output power transistor N1 (although the timings are not completely opposite actually because there is the period while the both transistors are turned off, it is considered to include the case in the description of this specification).

Figure 14:
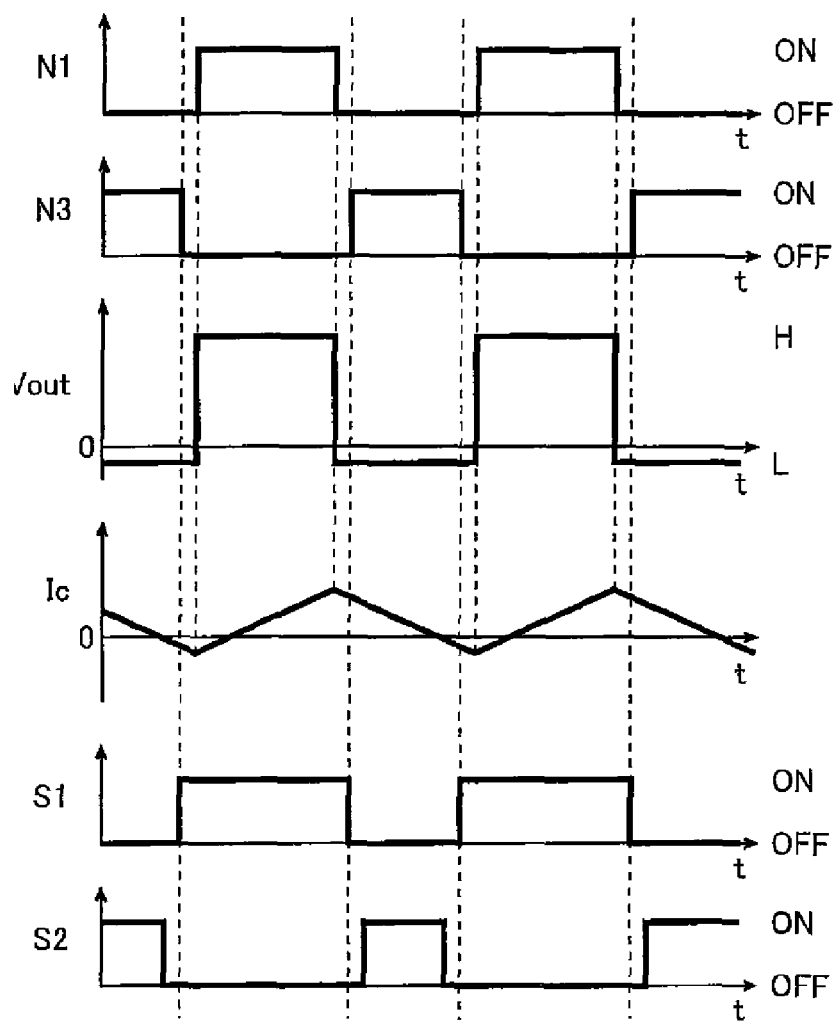
FIG. 14 is a timing chart for explaining a switching action of a continuous pulse driving transistor N3.

FIG. 14 is a timing chart for explaining a switching action of the continuous pulse driving transistor N3.

As shown in FIG. 14, the continuous pulse driving transistor N3 is controlled to switch so as to be turned off before the waveform of the output voltage Vout becomes a high potential (H level) (Condition (5)), and to be turned on after the waveform of the output voltage Vout becomes a low potential (L level) (Condition (6)).

This switching control of the continuous pulse driving transistor N3 enables the step-down chopper regulator of the present embodiment to supply negative current as the coil current Ic. Therefore, it is able to supply the coil current Ic continuously so that a boot malfunction due to the discontinuous mode for a light load can be avoided.

Note that since the continuous pulse portion control circuit CTRL3 generates the second logic signal from the output signal of the drive circuit DRV (the gate signal of the output power transistor N1) as described above, the above-mentioned condition (6) can be satisfied securely.

In addition, in parallel with the above-mentioned continuous pulse drive control, the back gate control circuit CTRL2b generates individual control signals for turning on the first switch S1 and turning off the second switch S2 by using the second logic signal generated by the continuous pulse drive portion control circuit CTRL3.

Figure 15:
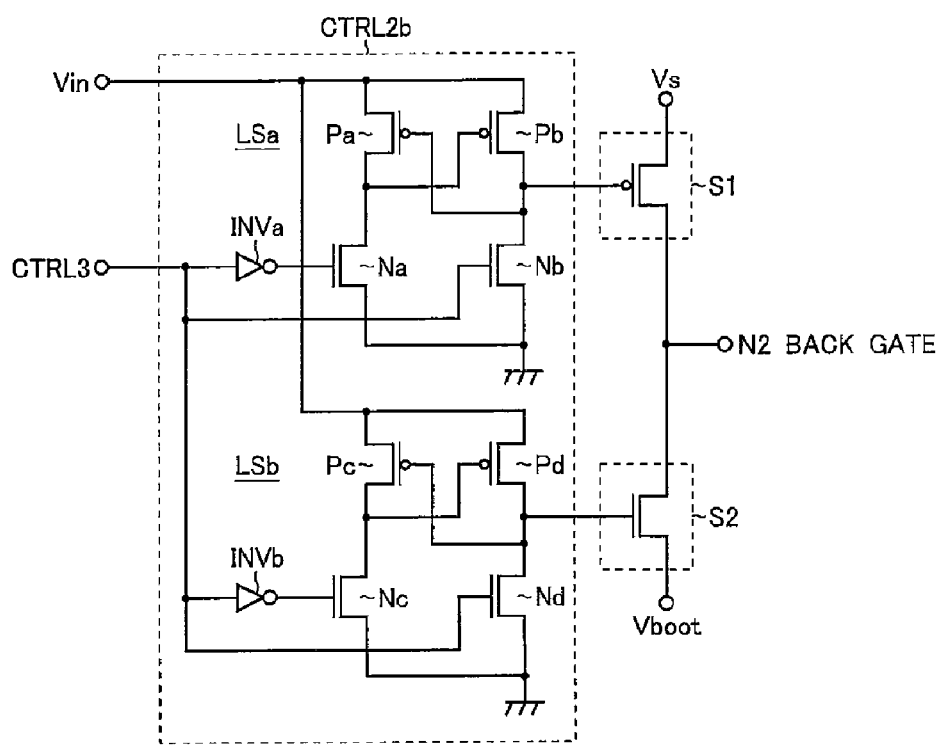
FIG. 15 is a circuit diagram showing an example of a structure of a back gate control circuit CTRL2b.

FIG. 15 is a circuit diagram showing an example of a structure of the back gate control circuit CTRL2b.

The main logic generating circuit CTRL1 and the continuous pulse portion control circuit CTRL3 are structured to operate with a low voltage (e.g., 3 volts) from a viewpoint of low consumption current. Since the first and the second switches S1 and S2 are required to operate with a high voltage (e.g., 5 volts or higher), a level shifting circuit is necessary for performing control of turning on and off the first and the second switches S1 and S2 based on the second logic signal.

Therefore, the back gate control circuit CTRL2b of the present embodiment includes a first and a second level shifting circuits LSa and LSb that generate the on/off signals of the first and the second switches S1 and S2 (the P-channel MOS transistor and the N-channel MOS transistor in FIG. 15) by shifting the second logic signal supplied from the continuous pulse portion control circuit CTRL3 to a predetermined voltage level (input voltage Vin–ground voltage GND).

The first level shifting circuit LSa includes P-channel MOS transistors Pa and Pb, N-channel MOS transistors Na and Nb and an inverter INVa.

Sources of the transistors Pa and Pb are both connected to a terminal to which the input voltage Vin is applied. A drain of the transistor Pa is connected to a drain of the transistor Na. On the other hand, it is also connected to the gate of a transistor Pb. A drain of the transistor Pb is connected to a drain of the transistor Nb. On the other hand, it is also connected to the gate of the transistor Pa. Sources of the transistors Na and Nb are both connected to the ground terminal. A gate of the transistor Na is connected to the second logic signal output terminal of the continuous pulse portion control circuit CTRL3 via the inverter INVa. A gate of the transistor Nb is connected directly to the second logic signal output terminal of the continuous pulse portion control circuit CTRL3. A drain of the transistor Pb is connected to the gate of the P-channel MOS transistor that constitute the first switch S1.

The second level shifting circuit LSb includes P-channel MOS transistors Pc and Pd, N-channel MOS transistors Nc and Nd and an inverter INVb.

Sources of the transistors Pc and Pd are both connected to a terminal to which the input voltage Vin is applied. A drain of the transistor Pc is connected to a drain of the transistor Nc. On the other hand, it is also connected to a gate of the transistor Pd. A drain of the transistor Pd is connected to a drain of the transistor Nd. On the other hand, it is also connected to a gate of the transistor Pc. Sources of the transistors Nc and Nd are both connected to the ground terminal. A gate of the transistor Nc is connected to the second logic signal output terminal of the continuous pulse portion control circuit CTRL3 via the inverter INVb. A gate of the transistor Nd is connected directly to the second logic signal output terminal of the continuous pulse portion control circuit CTRL3. A drain of the transistor Pd is connected to a gate of the N-channel MOS transistor that constitutes the second switch S2.

Using the back gate control circuit CTRL2b having the structure described above, control of turning on and off the first and the second switches S1 and S2 is performed base on the second logic signal, so that the second switch S2 can be turned off before the waveform of the output voltage Vout becomes a high potential (H level). Thus, the above-mentioned condition (1) can be satisfied. In addition, since the first switch S1 can be turned on before the waveform of the output voltage Vout becomes a high potential (H level), the above-mentioned condition (3) can be satisfied.

In addition, as to the step-down chopper regulator of the present embodiment, the control signal for the continuous pulse driving transistor N3 and the control signal for the LDMOS transistor N2 are the same signal. Therefore, the logic generating circuit for the LDMOS transistor N2 can be eliminated. Therefore, it is able to realize the step-down chopper regulator that is stable in a wide load range and has high efficiency at low cost.

In addition, as to the back gate control circuit CTRL2b of the present embodiment, the first and the second level shifting circuits LSa and LSb have different sizes of transistors that constitute them so that there is a period while both the first and the second switches S1 and S2 are turned off.

When the supplied second logic signal is switched from the high level to the low level, each of the gate voltages of the transistors that constitute the first and the second switches S1 and S2 changes from the low level to the high level. Therefore, the first switch S1 is switched from on to off, and the second switch S2 is switched from off to on. In this case, if a size of the transistor Pb is designed to be larger than a size of the transistor Pd, for example, the timing when the first switch S1 is switched from on to off becomes earlier than the timing when the second switch S2 is switched from off to on. Therefore, the above-mentioned condition (2) can be satisfied.

On the contrary, when the supplied second logic signal is switched from the low level to the high level, each of the gate voltages of the transistors that constitute the first and the second switches S1 and S2 changes from the high level to the low level. Therefore, the first switch S1 is switched from off to on, and the second switch S2 is switched from on to off. In this case, if a size of the transistor Nd is designed to be larger than a size of the transistor Nb, for example, the timing when the second switch S2 is switched from on to off becomes earlier than the timing when the first switch S1 is switched from off to on. Therefore, the above-mentioned condition (2) can be satisfied.

In this way, the back gate control circuit CTRL2b of the present embodiment can satisfy the above-mentioned condition (2) securely without adding a special circuit.

Next, a fourth embodiment of the step-down chopper regulator according to the present invention will be described in detail with reference to FIG. 16.

Figure 16:
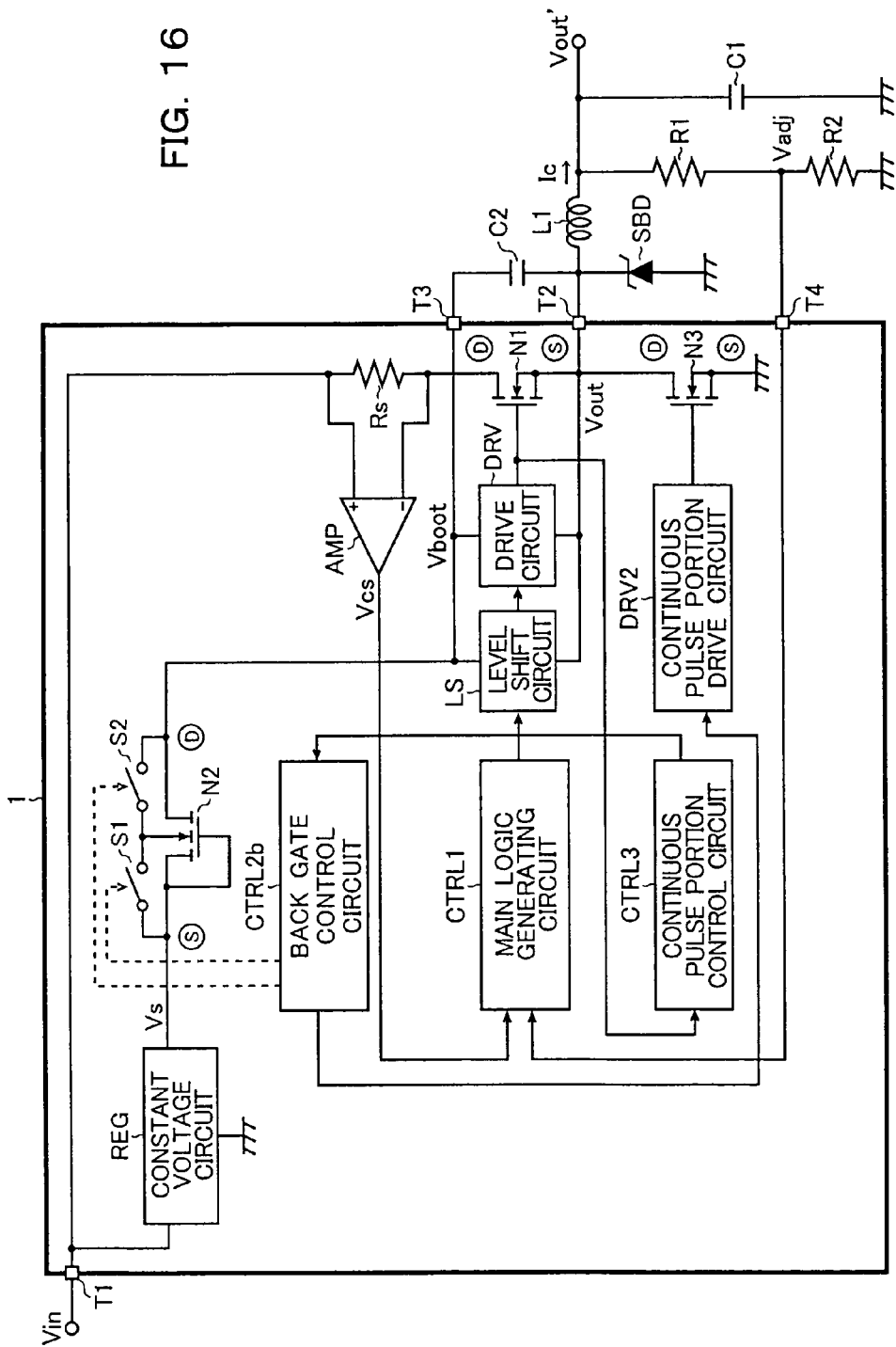
FIG. 16 is a diagram showing a fourth embodiment of the step-down chopper regulator according to the present invention.

FIG. 16 is a diagram showing a fourth embodiment of the step-down chopper regulator according to the present invention.

Note that the step-down chopper regulator of the present embodiment has a structure that is substantially the same as that in the third embodiment described above. Therefore, parts similar to the third embodiment are denoted by the same reference signs as those in FIG. 12 so that the descriptions thereof will be omitted. Only the characteristic portions of the present embodiment will be described mainly in the following explanation.

As shown in FIG. 16, the continuous pulse portion drive circuit DRV2 in the step-down chopper regulator of the present embodiment does not receive the second logic signal directly from the continuous pulse portion control circuit CTRL3 but performs control of turning on and off the continuous pulse driving transistor N3 based on the output signal of the back gate control circuit CTRL2b. More specifically, the continuous pulse driving transistor N3 is turned on when the second switch S2 is turned on.

In the state where the coil current Ic flows in the opposite direction for a light load, the output voltage Vout will increase if the continuous pulse driving transistor N3 is turned off. Therefore, the off timing of the second switch S2 is required to be earlier than the off timing of the continuous pulse driving transistor N3. If the structure of the present embodiment is adopted, the above-mentioned condition (1) can be satisfied securely. In other words, it can be said that the structure of the fourth embodiment becomes effective if drive of the second switch S2 is slower than the drive of the continuous pulse driving transistor N3. Note that the structure of the present embodiment can be adopted simultaneously with the structure of the third embodiment. In other words, it is possible to adopt the structure of wiring between the continuous pulse portion control circuit CTRL3 and the continuous pulse portion drive circuit DRV2.

Next, a fifth embodiment of the step-down chopper regulator according to the present invention will be described in detail with reference to FIG. 17.

Figure 17:
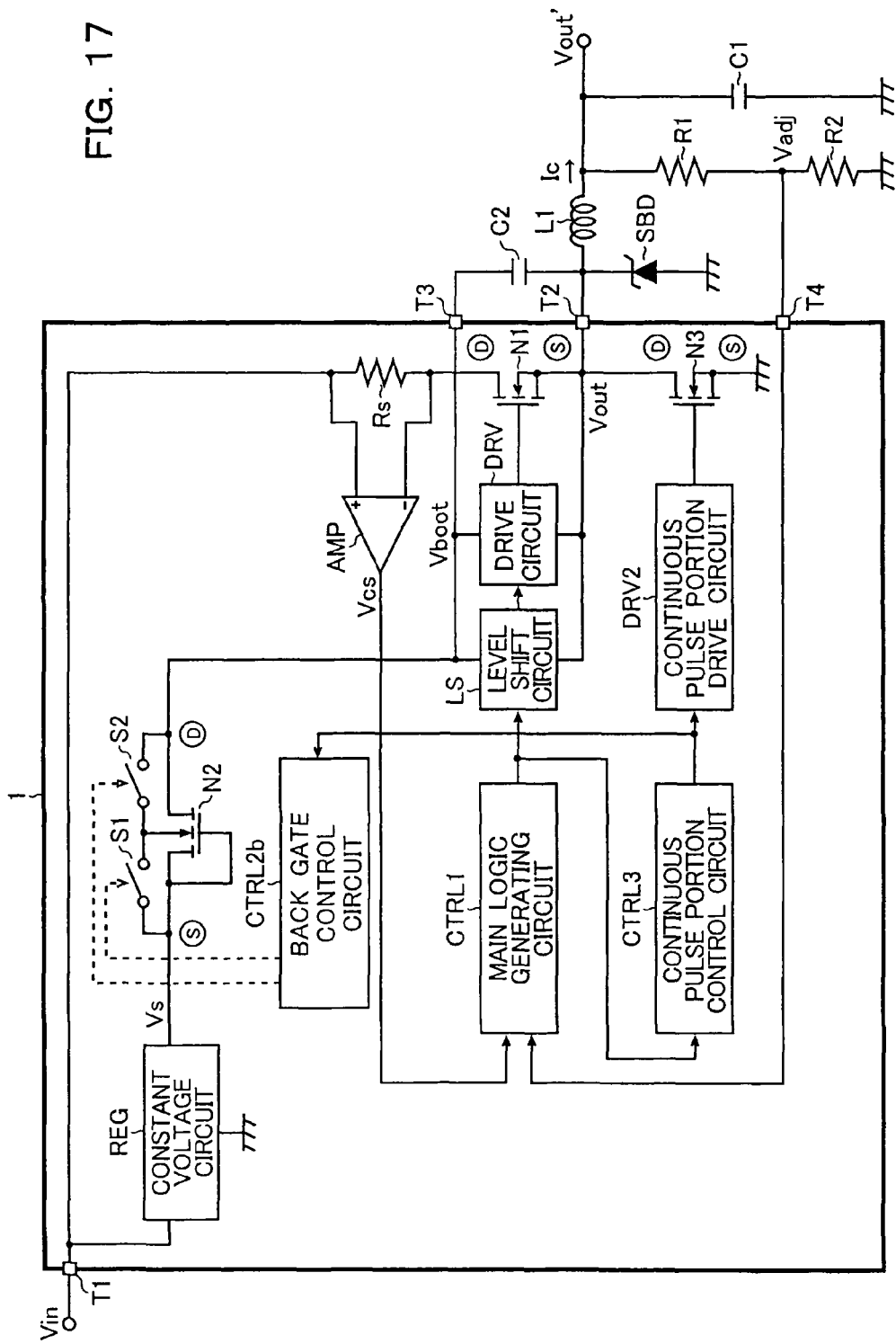
FIG. 17 is a diagram showing a fifth embodiment of the step-down chopper regulator according to the present invention.

FIG. 17 is a diagram showing a fifth embodiment of the step-down chopper regulator according to the present invention.

Note that the step-down chopper regulator of the present embodiment has a structure that is substantially the same as that in the third embodiment described above. Therefore, parts similar to the third embodiment are denoted by the same reference signs as those in FIG. 12 so that the descriptions thereof will be omitted. Only the characteristic portions of the present embodiment will be described mainly in the following explanation.

As shown in FIG. 17, as to the step-down chopper regulator of the present embodiment, the continuous pulse portion control circuit CTRL3 has the structure of generating the second logic signal from the first logic signal. Note that the first logic signal is used also for driving the output power transistor N1, but there are the level shifting circuit LS and the drive circuit DRV having a long logic transfer time between the main logic generating circuit CTRL1 and the output power transistor N1. Therefore, the continuous pulse driving transistor N3 is turned on and off at an earlier timing. Therefore, the above-mentioned condition (5) can be satisfied securely.

Note that the structure of the third embodiment can satisfy the above-mentioned condition (6) securely while the structure of the fifth embodiment can satisfy the above-mentioned condition (5) securely. It is possible to adopt one of the third and the fifth embodiments or to adopt both of them. However, if one of them is adopted, it is considered that the continuous pulse portion control circuit CTRL3 will need a certain delay circuit (e.g., a CR time constant circuit including a capacitor and a resistor) for satisfying the other condition.

Next, a sixth embodiment of the step-down chopper regulator according to the present invention will be described in detail with reference to FIG. 18.

Figure 18:
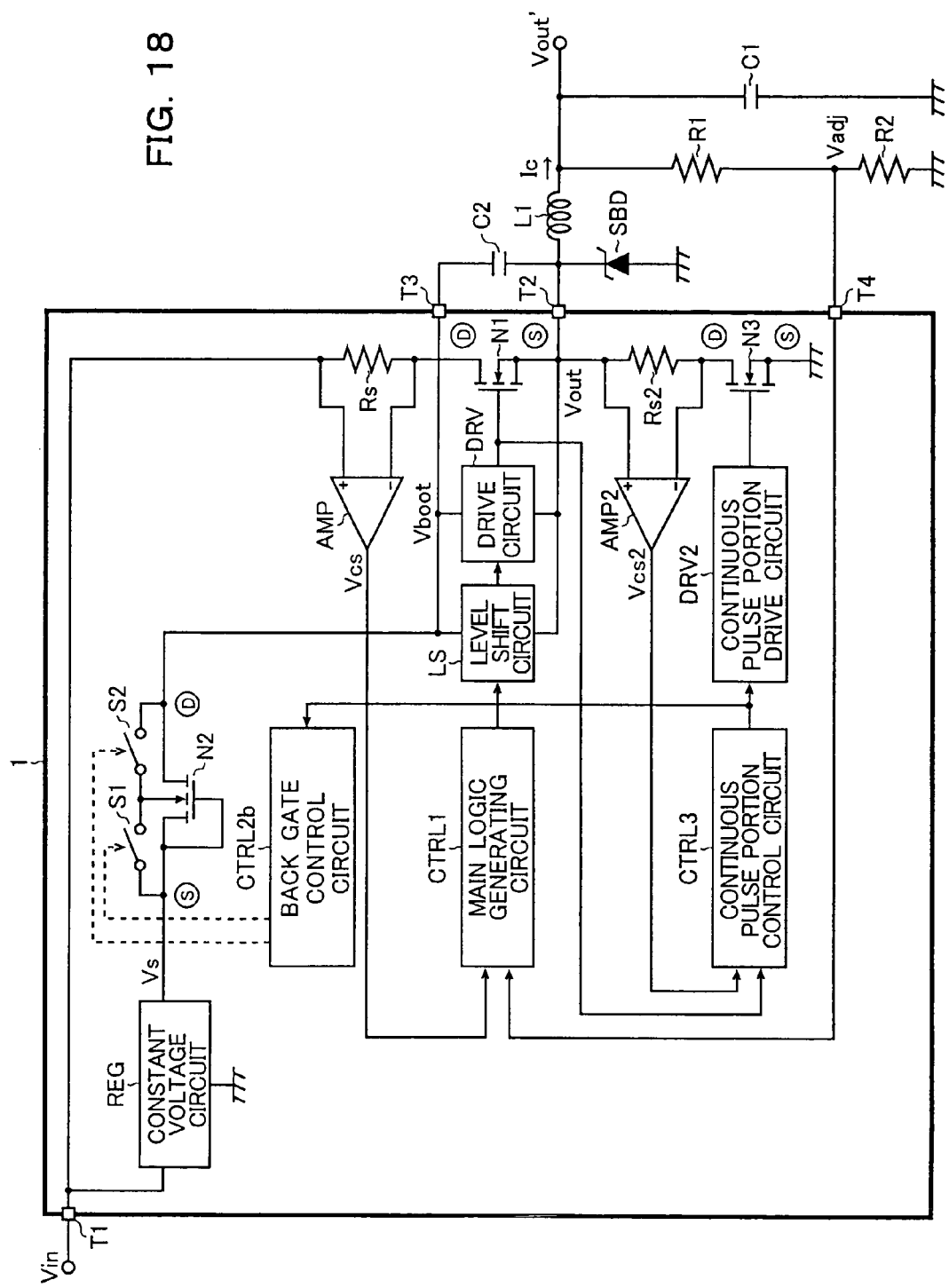
FIG. 18 is a diagram showing a sixth embodiment of the step-down chopper regulator according to the present invention.

FIG. 18 is a diagram showing a sixth embodiment of the step-down chopper regulator according to the present invention.

Note that the step-down chopper regulator of the present embodiment has a structure that is substantially the same as that in the third embodiment described above. Therefore, parts similar to the third embodiment are denoted by the same reference signs as those in FIG. 12 so that the descriptions thereof will be omitted. Only the characteristic portions of the present embodiment will be described mainly in the following explanation.

As shown in FIG. 18, the step-down chopper regulator of the present embodiment includes a current sensing circuit (a sensing resistor Rs2 and a sensing amplifier AMP2) for sensing current that flows in the continuous pulse driving transistor N3. The continuous pulse portion control circuit CTRL3 generates the second logic signal in accordance with an output signal (a sensed voltage Vcs2) of the current sensing circuit.

When the continuous pulse driving transistor N3 is turned on, current flows from the output inductor L1 to the ground terminal through the output terminal T2 and the continuous pulse driving transistor N3. If the current value becomes too large (e.g., 200 milliamperes or more), efficiency of power supply may be lowered or it may exceed an allowable current value of the continuous pulse driving transistor N3.

Therefore, the step-down chopper regulator of the present embodiment has a structure in which current that flows in the continuous pulse driving transistor N3 is sensed, and the continuous pulse portion control circuit CTRL3 generates the second logic signal so that the continuous pulse driving transistor N3 is turned off if the sensed current reaches a predetermined threshold value.

More specifically, although the output power transistor N1 and the continuous pulse driving transistor N3 are normally controlled to switch to be the opposite logic, the continuous pulse driving transistor N3 is turned off first without depending on an on/off state of the output power transistor N1 (i.e., the gate signal for the output power transistor N1) if an overcurrent sensing signal obtained by comparing the sensed voltage Vcs2 with a predetermined threshold value voltage becomes the high level (an overcurrent state).

In other words, the continuous pulse portion control circuit CTRL3 of the present embodiment performs a NOT-OR operation between the gate signal for the output power transistor N1 and the above-mentioned overcurrent sensing signal, and a result of the operation is delivered as the second logic signal. In other words, the second logic signal generated by the continuous pulse portion control circuit CTRL3 of the present embodiment becomes the high level only in the case where both the gate signal for the output power transistor N1 and the above-mentioned overcurrent sensing signal are the low level, and otherwise it becomes the low level.

Figure 19:
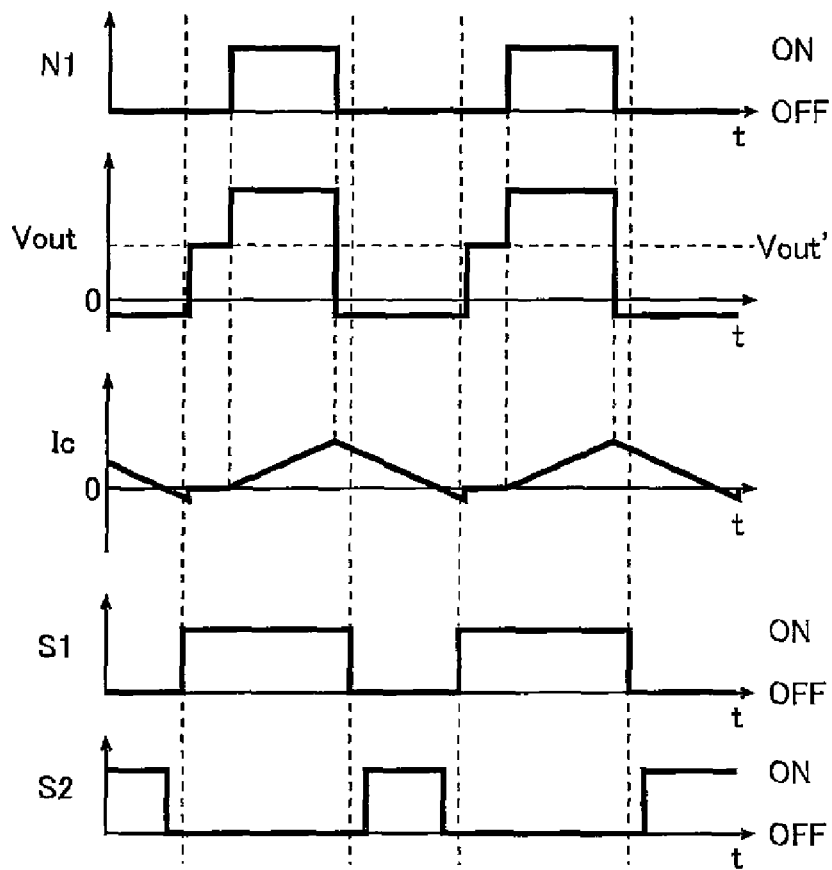
FIG. 19 is a timing chart for explaining a switching action of a continuous pulse driving transistor N3 based on overcurrent sensing.

According to this structure, if a value of the current flowing in the continuous pulse driving transistor N3 becomes too large, the on/off states of the first and the second switches S1 and S2 are set appropriately before the original timing when the continuous pulse driving transistor N3 is switched. Therefore, even if the bootstrap action becomes the discontinuous mode, the above-mentioned condition (1) can be satisfied as shown in FIG. 19 (the timing chart for explaining the switching action of the continuous pulse driving transistor N3 based on overcurrent sensing).

Finally, a seventh embodiment of the step-down chopper regulator according to the present invention will be described in detail with reference to FIG. 20.

Figure 20:
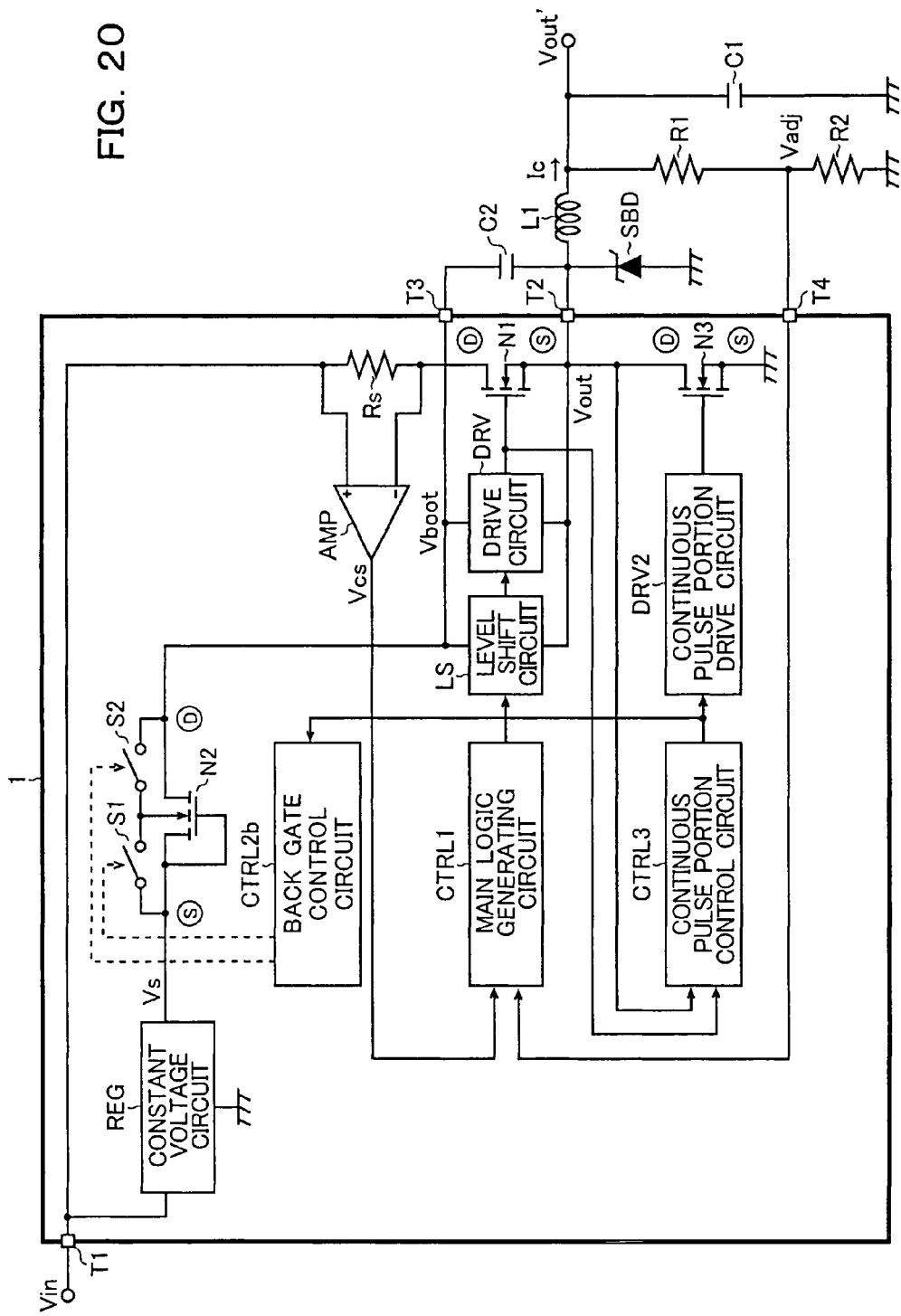
FIG. 20 is a diagram showing a seventh embodiment of the step-down chopper regulator according to the present invention.

FIG. 20 is a diagram showing a seventh embodiment of the step-down chopper regulator according to the present invention.

Note that the step-down chopper regulator of the present embodiment has a structure that is substantially the same as that in the third embodiment described above. Therefore, parts similar to the third embodiment are denoted by the same reference signs as those in FIG. 12 so that the descriptions thereof will be omitted. Only the characteristic portions of the present embodiment will be described mainly in the following explanation.

As shown in FIG. 20, the step-down chopper regulator of the present embodiment has a structure in which the continuous pulse portion control circuit CTRL3 generates the second logic signal in accordance with the output voltage Vout.

The continuous pulse driving transistor N3 is usually made up of a transistor having a high on-resistance of approximately 10 ohms. Therefore, if a value of current flowing in the continuous pulse driving transistor N3 becomes too large, the output voltage Vout increases so that the above-mentioned condition (1) cannot be satisfied.

Therefore, the step-down chopper regulator of the present embodiment has the structure in which the output voltage Vout is sensed, and the continuous pulse portion control circuit CTRL3 generates the second logic signal so that the continuous pulse driving transistor N3 is turned off before it becomes the state where the above-mentioned condition (1) cannot be satisfied (the overcurrent state).

More specifically, although the output power transistor N1 and the continuous pulse driving transistor N3 are normally controlled to switch to be the opposite logic, the continuous pulse driving transistor N3 is turned off first without depending on an on/off state of the output power transistor N1 (i.e., the gate signal for the output power transistor N1) if an overcurrent sensing signal obtained by comparing the output voltage Vout with a predetermined threshold value voltage becomes the high level (the overcurrent state).

In other words, the continuous pulse portion control circuit CTRL3 of the present embodiment performs a NOT-OR operation between the gate signal for the output power transistor N1 and the above-mentioned overcurrent sensing signal, and a result of the operation is delivered as the second logic signal. In other words, the second logic signal generated by the continuous pulse portion control circuit CTRL3 of the present embodiment becomes the high level only in the case where both the gate signal for the output power transistor N1 and the above-mentioned overcurrent sensing signal are the low level, and otherwise it becomes the low level.

According to this structure, it is able to suppress increase of current that flows in the continuous pulse driving transistor N3 (as well as increase of the output voltage Vout), so that a secure bootstrap action call be realized.

Note that the structure of the present invention is not limited to the embodiments described above but can be modified variously within the scope of the present invention without deviating from the spirit thereof.

For example, although the embodiment described above exemplifies the structure in which the N-channel LDMOS transistor N1 is used as the output power transistor, the present invention is not limited to this structure. It is possible to use an N-channel MOS transistor or to use an NPN bipolar transistor if it is added externally to the semiconductor device 1.

In addition, although the embodiment described above exemplifies the structure in which the N-channel LDMOS transistor N2 is used as the substitute element of the boot diode, the present is not limited to this structure. It is possible to use a P-channel LDMOS transistor.

As to effects of the present invention, the semiconductor device for the step-down chopper regulator according to the present invention can support high-speed oscillation without using an expensive BiCDMOS process, by using the LDMOS transistor instead of the conventional boot diode. In addition, since the constant voltage circuit that generates a desired constant voltage from the input voltage with reference to the ground voltage is provided, the stable step-down chopping action with a wide input voltage range can be realized. In addition, since a continuous pulse drive function including the second switching element is provided, a secure boot operation can be performed even for a light load.

In addition, as to industrial usability of the present invention, the present invention provided techniques that is generally useful for electronic equipment equipped with a step-down chopper regulator. In particular, it provides techniques that are suitable for electronic equipment that is required to have high efficiency (e.g., on-vehicle equipment such as a car audio machine, AV equipment such as a liquid crystal television set or a DVD player, computer peripheral equipment such as an optical storage apparatus (including a CD-ROM drive, a CD-R/RW drive, a DVD-ROM drive, a DVD-R/RW drive and the like).

What is claimed is:

1. A semiconductor device comprising:
a first switching element connected in series between a terminal to which an input voltage is applied and a leader terminal of an output voltage;
a constant voltage circuit that generates a desired constant voltage from the input voltage with reference to a ground voltage;
a bootstrap circuit that receives the constant voltage and generates a boot voltage that is higher than the output voltage;
a first logic generating circuit that generates a first logic signal for performing control of turning on and off the first switching element; and
a first drive circuit that performs control of turning on and off the first switching element by using the boot voltage based on the first logic signal,
wherein the bootstrap circuit includes
an LDMOS transistor having a source connected to an output terminal of the constant voltage circuit and a drain connected to a leader terminal of the boot voltage, and
a bootstrap control circuit that performs control of turning on and off the LDMOS transistor, and
wherein the bootstrap control circuit controls a back gate of the LDMOS transistor so as to control of turning on and off the LDMOS transistor.

2. The semiconductor device according to claim 1, wherein the bootstrap control circuit includes
a first switch connected between the back gate and the source of the LDMOS transistor,
a second switch connected between the back gate and the drain of the LDMOS transistor, and
a boot portion control circuit and a back gate control circuit that perform control of turning on and off the first and the second switch in accordance with the first logic signal.

3. The semiconductor device according to claim 2, wherein the first switch is a P-channel MOS transistor, and the second switch is an N-channel MOS transistor.

4. The semiconductor device according to claim 3, wherein the first and the second switches are middle withstand voltage elements having a withstand voltage in the range within 7-40 volts or high withstand voltage elements having a withstand voltage in the range within 40-60 volts.

5. The semiconductor device according to claim 2, wherein the boot portion control circuit and the back gate control circuit perform control of turning on and off the first and the second switches so as to have a period while both the first and the second switches are turned off.

6. A semiconductor device comprising:
a first switching element connected in series between a terminal to which an input voltage is applied and a leader terminal of an output voltage;
a constant voltage circuit that generates a desired constant voltage from the input voltage with reference to a ground voltage;
a bootstrap circuit that receives the constant voltage and generates a boot voltage that is higher than the output voltage;
a first logic generating circuit that generates a first logic signal for performing control of turning on and off the first switching element; and
a first drive circuit that performs control of turning on and off the first switching element by using the boot voltage based on the first logic signal,
wherein the bootstrap circuit includes
an LDMOS transistor having a source connected to an output terminal of the constant voltage circuit and a drain connected to a leader terminal of the boot voltage, and
a bootstrap control circuit that performs control of turning on and off the LDMOS transistor,
wherein the bootstrap circuit controls a back gate of the LDMOS transistor so as to control of turning on and off the LDMOS transistor, and
wherein the constant voltage is lower than gate withstand voltage of the LDMOS transistor, and a voltage dropped between the gate and the drain of the LDMOS transistor is set to a voltage value lower than withstand voltage of the first drive circuit.

7. The semiconductor device according to claim 1, further comprising a second constant voltage circuit that generates a second constant voltage that is higher than the constant voltage from the input voltage with reference to the ground voltage, wherein the bootstrap control circuit includes
a first switch connected between the back gate and the source of the LDMOS transistor,
a second switch connected between the back gate and the drain of the LDMOS transistor,
a third switch connected between the back gate and the source of the LDMOS transistor,
a fourth switch connected between the gate of the LDMOS transistor and the output terminal of the second constant voltage circuit, and
a boot portion control circuit and a back gate control circuit that perform control of turning on and off the first through the fourth switches based on an output of the first logic generating circuit.

8. The semiconductor device according to claim 7, wherein the second constant voltage is set to gate withstand voltage of the LDMOS transistor.

9. A semiconductor device comprising:
a first switching element connected in series between a terminal to which an input voltage is applied and a leader terminal of an output voltage;
a constant voltage circuit that generates a desired constant voltage from the input voltage with reference to a ground voltage;
a bootstrap circuit that receives the constant voltage and generates a boot voltage that is higher than the output voltage;
a first logic generating circuit that generates a first logic signal for performing control of turning on and off the first switching element; and
a first drive circuit that performs control of turning on and off the first switching element by using the boot voltage based on the first logic signal,
wherein the bootstrap circuit includes
an LDMOS transistor having a source connected to an output terminal of the constant voltage circuit and a drain connected to a leader terminal of the boot voltage, and
a bootstrap control circuit that performs control of turning on and off the LDMOS transistor, and
wherein the semiconductor device further comprises a zener diode having the cathode connected to the output terminal of the constant voltage circuit and the anode connected to the ground.

10. The semiconductor device according to claim 9, wherein the constant voltage is set to a voltage value that is lower than a zener voltage of the zener diode.

11. A semiconductor device comprising:
- a first switching element connected in series between a terminal to which an input voltage is applied and a leader terminal of an output voltage;
- a constant voltage circuit that generates a desired constant voltage from the input voltage with reference to a around voltage;
- a bootstrap circuit that receives the constant voltage and generates a boot voltage that is higher than the output voltage;
- a first logic generating circuit that generates a first logic signal for performing control of turning on and off the first switching element; and
- a first drive circuit that performs control of turning on and off the first switching element by using the boot voltage based on the first logic signal,
- wherein the bootstrap circuit includes
- an LDMOS transistor having a source connected to an output terminal of the constant voltage circuit and a drain connected to a leader terminal of the boot voltage, and
- a bootstrap control circuit that performs control of turning on and off the LDMOS transistor,
- wherein the semiconductor device further comprises:
- a second switching element connected in series between the leader terminal of the output voltage and the ground terminal;
- a second logic generating circuit that generates a second logic signal for performing control of turning on and off the second switching element; and
- a second drive circuit that performs control of turning on and off the second switching element based on the second logic signal; and
- wherein the bootstrap control circuit controls the back gate of the LDMOS transistor so as to perform the control of turning on and off the LDMOS transistor.

12. The semiconductor device according to claim 11, wherein the bootstrap control circuit includes
- a first switch connected between the back gate and the source of the LDMOS transistor,
- a second switch connected between the back gate and the drain of the LDMOS transistor, and
- a back gate control circuit that performs control of turning on and off the first and the second switches in accordance with the second logic signal.

13. The semiconductor device according to claim 12, wherein the second drive circuit performs control of turning on and off the second switching element based on an output signal of the back gate control circuit.

14. The semiconductor device according to claim 11, wherein the second logic generating circuit generates the second logic signal from an output signal of the first drive circuit.

15. The semiconductor device according to claim 11, wherein the second logic generating circuit generates the second logic signal from the first logic signal.

16. The semiconductor device according to claim 12, wherein the back gate control circuit includes first and second level shifting circuits that shift the second logic signal to a predetermined voltage level so as to generate an on/off signal of the first and the second switches, wherein sizes of transistors that constitute the first and the second level shifting circuits are different so as to have a period while both the first and the second switches are turned off.

17. The semiconductor device according to claim 11, wherein the semiconductor device further includes a current sensing circuit that senses current flowing in the second switching element, wherein the second logic generating circuit generates the second logic signal in accordance with an output signal of the current sensing circuit.

18. The semiconductor device according to claim 11, wherein the second logic generating circuit generates the second logic signal in accordance with the output voltage.

19. A step-down chopper regulator comprising:
- a semiconductor device;
- a boot capacitor connected externally between the leader terminal of the output voltage and the leader terminal of the boot voltage; and
- a smoothing circuit connected externally between the leader terminal of the output voltage and a load,
- wherein the step-down chopper regulator step-downs the input voltage and supplies it to the load; and
- wherein the semiconductor device comprises:
- a first switching element connected in series between a terminal to which an input voltage is applied and a leader terminal of an output voltage;
- a constant voltage circuit that generates a desired constant voltage from the input voltage with reference to a ground voltage;
- a bootstrap circuit that receives the constant voltage and generates a boot voltage that is higher than the output voltage;
- a first logic generating circuit that generates a first logic signal for performing control of turning on and off the first switching element; and
- a first drive circuit that performs control of turning on and off the first switching element by using the boot voltage based on the first logic signal,
- wherein the bootstrap circuit includes
- an LDMOS transistor having a source connected to an output terminal of the constant voltage circuit and a drain connected to a leader terminal of the boot voltage, and
- a bootstrap control circuit that performs control of turning on and off the LDMOS transistor.

20. An electronic equipment comprising:
- a step-down chopper regulator according to claim 19; and
- a load that is supplied with a drive voltage from the step-down chopper regulator.

* * * * *